US012168981B2

(12) United States Patent
Acharya et al.

(10) Patent No.: US 12,168,981 B2
(45) Date of Patent: *Dec. 17, 2024

(54) AIR COOLING SYSTEM FOR ELECTRONIC SPINNING ASSEMBLY

(71) Applicant: Waymo LLC, Mountain View, CA (US)

(72) Inventors: Rutvik Acharya, San Jose, CA (US); Simon Ellgas, San Jose, CA (US); Benjamin Chen, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,741

(22) Filed: Aug. 3, 2023

(65) Prior Publication Data

US 2024/0191715 A1 Jun. 13, 2024

Related U.S. Application Data

(63) Continuation of application No. 18/063,754, filed on Dec. 9, 2022, now Pat. No. 11,781,549.

(51) Int. Cl.
*F04D 1/00* (2006.01)
*B60H 1/00* (2006.01)
*F01D 25/28* (2006.01)

(52) U.S. Cl.
CPC .......... *F04D 1/00* (2013.01); *B60H 1/00271* (2013.01); *B60H 1/00521* (2013.01); *F01D 25/28* (2013.01); *B60H 2001/003* (2013.01)

(58) Field of Classification Search
CPC .. F04D 29/542; F04D 29/403; F04D 29/2244; F04D 19/00; F04D 23/00;
(Continued)

(56) References Cited

U.S. PATENT DOCUMENTS 9,157,452 B2 10/2015 Sadi
10,458,417 B2 10/2019 Hsiung et al.
(Continued)

FOREIGN PATENT DOCUMENTS

CN 106704255 5/2017
CN 208870835 5/2019
(Continued)

OTHER PUBLICATIONS

M. Al-Ghriybah et al., "Review of the Recent Power Augmentation Techniques for the Savonius Wind Turbines," Research Gate, Journal of Advanced Research in Fluid Mechanics and Thermal Sciences, 60, Issue 1, 71-84 (2019).
(Continued)

*Primary Examiner* — Justin D Seabe
*Assistant Examiner* — Michael K. Reitz
(74) *Attorney, Agent, or Firm* — McDonnell Boehnen Hulbert & Berghoff LLP

(57) ABSTRACT

Example embodiments relate to an air cooling system for an electronic spinning assembly. An example embodiment includes a plurality of vanes coupled to a static base. A vane cover is rotatably coupled to the static base. The vane cover includes at least one air inlet, at least one air duct extending from the vane cover, and at least one choke point disposed in the cover. The at least one choke point is configured to increase a pressure of the airflow.

20 Claims, 15 Drawing Sheets

(58) Field of Classification Search
CPC .... F04D 23/005; F04D 17/168; F04D 17/165; B60H 1/00271; B60H 1/00521; B60H 2001/003; F05B 2210/404; H05K 7/20863
USPC .......................... 415/64, 65, 83, 84, 86, 87
See application file for complete search history.

(56) References Cited

U.S. PATENT DOCUMENTS

| | | |
|---|---|---|
| 10,744,853 B2 | 8/2020 | Jensen et al. |
| 2016/0024971 A1 | 1/2016 | Pearce et al. |
| 2018/0109061 A1 | 4/2018 | Pardhan et al. |
| 2019/0154800 A1 | 5/2019 | Schmidt |
| 2020/0088480 A1 | 3/2020 | Hu et al. |
| 2020/0191614 A1 | 6/2020 | Ellgas et al. |
| 2020/0271759 A1* | 8/2020 | Hattass ................... G01S 17/42 |
| 2021/0063093 A1 | 3/2021 | Tobiassen et al. |

FOREIGN PATENT DOCUMENTS

| | | |
|---|---|---|
| CN | 210949253 | 7/2020 |
| CN | 113915146 | 1/2022 |
| CN | 216895033 | 7/2022 |
| DE | 102010046448 | 3/2012 |
| JP | 3903463 | 4/2007 |
| WO | WO 2022/105210 | 5/2022 |

OTHER PUBLICATIONS

Extended European Search Report from European Application No. 23212115.2, dated May 16, 2024.

* cited by examiner

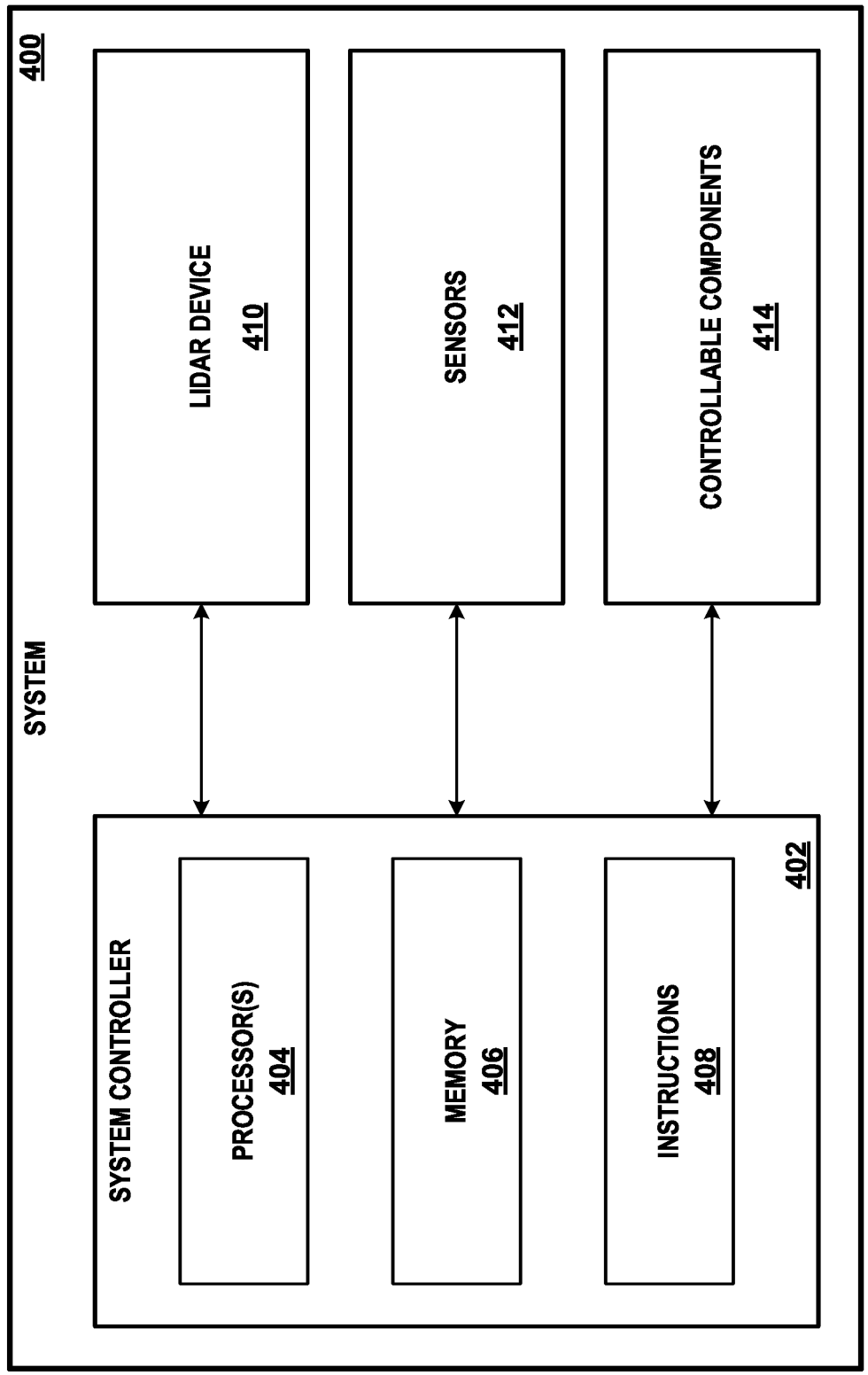

AIR COOLING SYSTEM FOR ELECTRONIC SPINNING ASSEMBLY

CROSS-REFERENCE TO RELATED APPLICATION

This application is a continuation of U.S. patent application Ser. No. 18/063,754, filed Dec. 9, 2022. This application is incorporated herein by reference in its entirety and for all purposes.

BACKGROUND

Unless otherwise indicated herein, the description in this section is not prior art to the claims in this application and is not admitted to be prior art by inclusion in this section.

Autonomous vehicles, for instance, vehicles that do not require a human driver, can be used to aid in the transport of passengers or items from one location to another. Such vehicles may operate in a partially autonomous mode (e.g., driver-assistance) or a fully autonomous mode (e.g., a mode where passengers may provide some initial input, such as a pickup or destination location, and the vehicle maneuvers itself to that location without the need for additional input from the passenger or any other human). Thus, such vehicles may be used to provide transportation services.

Various types of vehicles, such as cars, trucks, motorcycles, buses, boats, airplanes, helicopters, lawn mowers, recreational vehicles, amusement park vehicles, farm equipment, construction equipment, trams, golf carts, trains, trolleys, etc., may be equipped with various types of sensors in order to detect objects in the surrounding environment of the vehicle. For example, vehicles may include electronic spinning assemblies. The electronic spinning assemblies can include sensors such as light detection and ranging (lidar) sensors, radar sensors, sonar sensors, cameras, or other imaging sensors that scan and record data from the surrounding environment. Sensor data from one or more of these sensors may be used to detect objects and their respective characteristics (position, shape, heading, speed, etc.).

Operation of these electronic spinning assemblies may be adversely affected by the buildup of heat within the assembly itself. Typically, the assemblies include a housing to protect the internal components of the sensors from debris and contaminants, but over time, the housing may trap solar heat, as well as heat generated by the various internal components of the assembly. As such, the sensor components may be subjected to increased temperature conditions during operation.

One technique currently used to overcome the issue of overheating is to use an impeller to pull air through the electronic spinning assembly. Air is pulled into the electronic spinning assembly and then pushed out. However, this technique might not work with changing designs of electronic spinning assemblies. For example, blowing air might not adequately reach all of the areas that need to be cooled, such as heat sinks and camera arrays, and thus the electronic spinning assembly will not be adequately cooled.

SUMMARY

The present disclosure generally relates to a system for air cooling spinning electronic assemblies. The system can include static vanes and a rotating vane cover, which rotates with the spinning assembly, over the vanes. Utilizing the spinning of the assembly, air can be drawn up from below the assembly through the static vanes and up a plurality of ducts in the rotating cover to cool the spinning assembly.

In one aspect, the present application describes a device. The device can include a plurality of vanes coupled to a static base. The device can further include a vane cover rotatably coupled to the static base and at least partially enclosing the plurality of vanes. The vane cover can be coupled to an electronic spinning assembly and configured to rotate with the spinning assembly. The vane cover can further include at least one air inlet configured to act as an air intake for an airflow, at least one air duct extending from the vane cover configured to direct the airflow, and at least one choke point disposed in the cover. The at least one choke point can be configured to increase pressure of the airflow.

In another aspect, the present application describes a system. The system can include a vehicle, a static base mounted to the vehicle, and a plurality of vanes coupled to the static base. The system can further include a vane cover rotatably coupled to the static base and at least partially enclosing the plurality of vanes. The vane cover can be coupled to an electronic spinning assembly and configured to rotate with the spinning assembly. The vane cover can further include at least one air inlet configured to act as an air intake for an airflow, at least one air duct extending from the vane cover configured to direct the airflow, and at least one choke point disposed in the cover. The at least one choke point can be configured to increase pressure of the airflow.

These as well as other aspects, advantages, and alternatives will become apparent to those of ordinary skill in the art by reading the following detailed description, with reference, where appropriate, to the accompanying drawings.

BRIEF DESCRIPTION OF THE DRAWINGS

FIG. 4A is a block diagram of a system including a lidar device, according to example embodiments.

DETAILED DESCRIPTION

Figure 1:
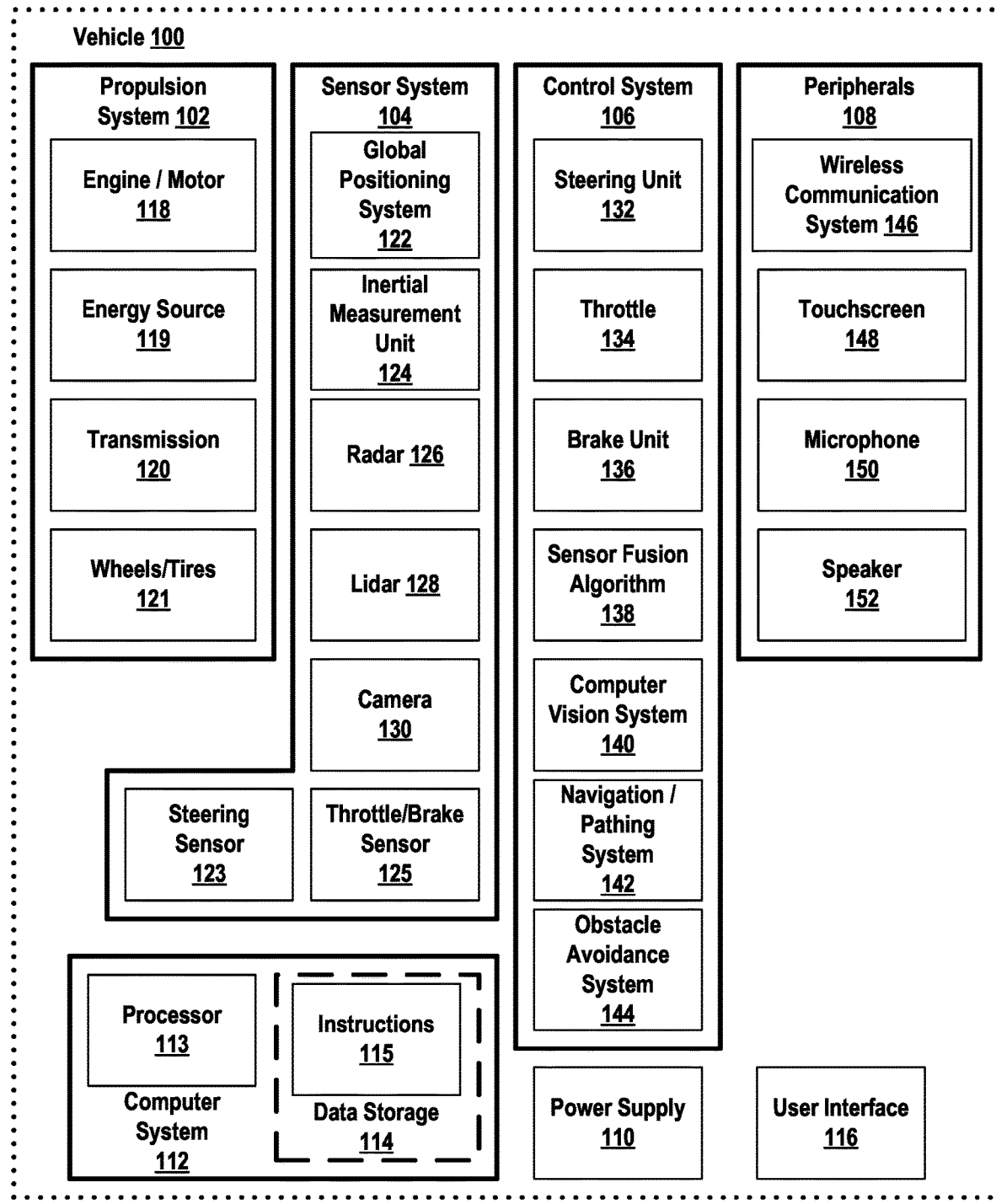
FIG. 1 is a functional block diagram illustrating a vehicle, according to example embodiments.
Figure 2A:
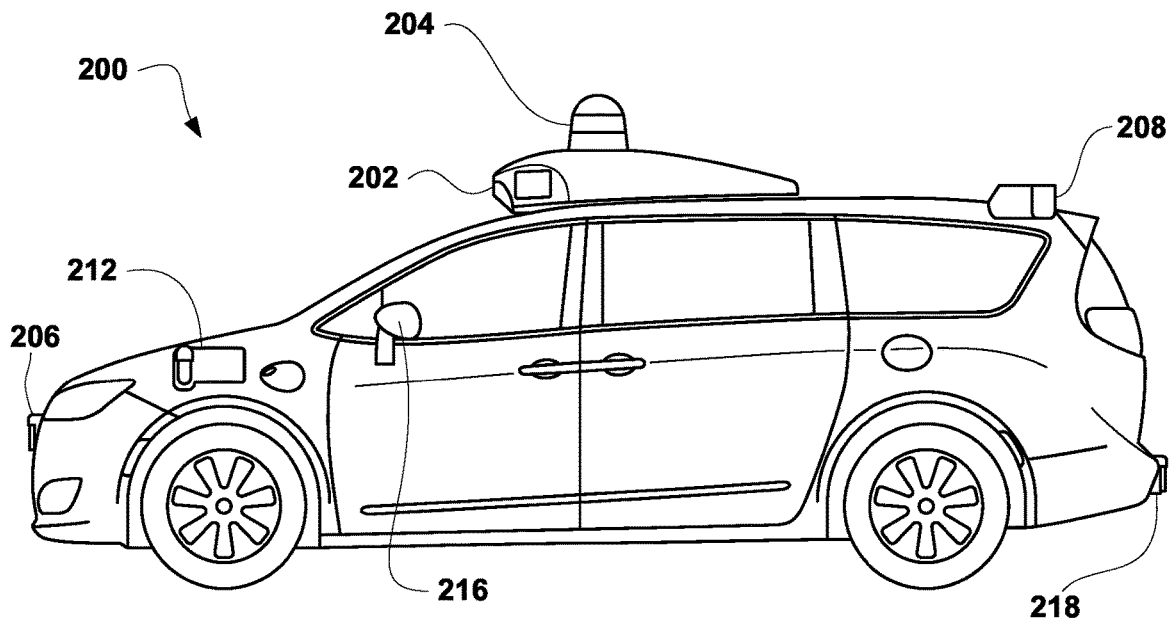
FIG. 2A is an illustration of a physical configuration of a vehicle, according to example embodiments.
Figure 2B:
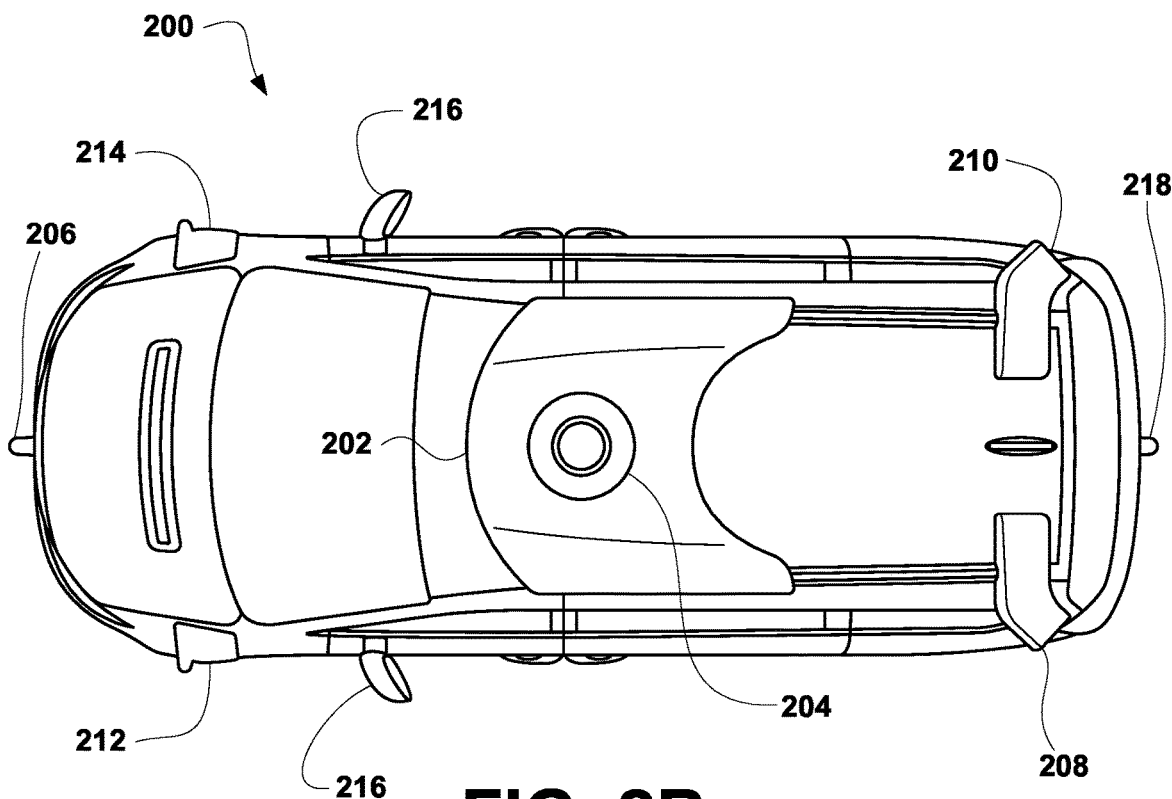
FIG. 2B is an illustration of a physical configuration of a vehicle, according to example embodiments.
Figure 2C:
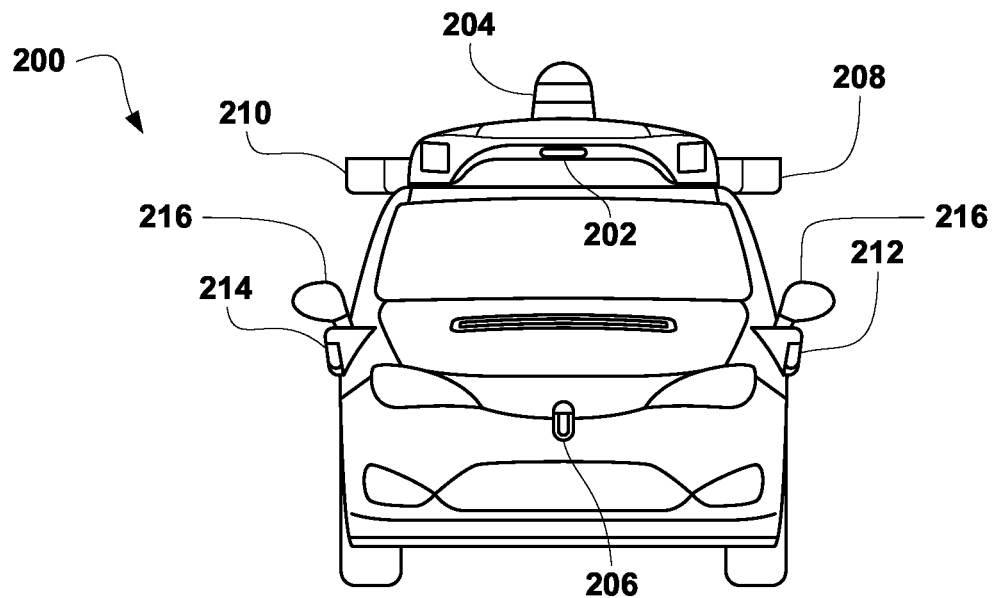
FIG. 2C is an illustration of a physical configuration of a vehicle, according to example embodiments.
Figure 2D:
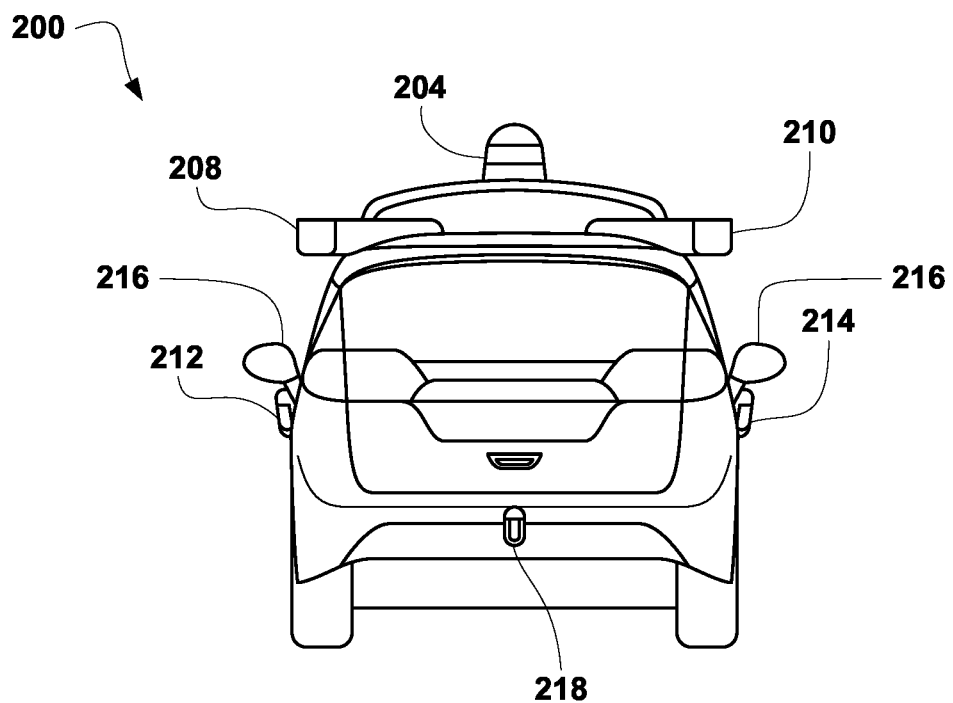
FIG. 2D is an illustration of a physical configuration of a vehicle, according to example embodiments.
Figure 2E:
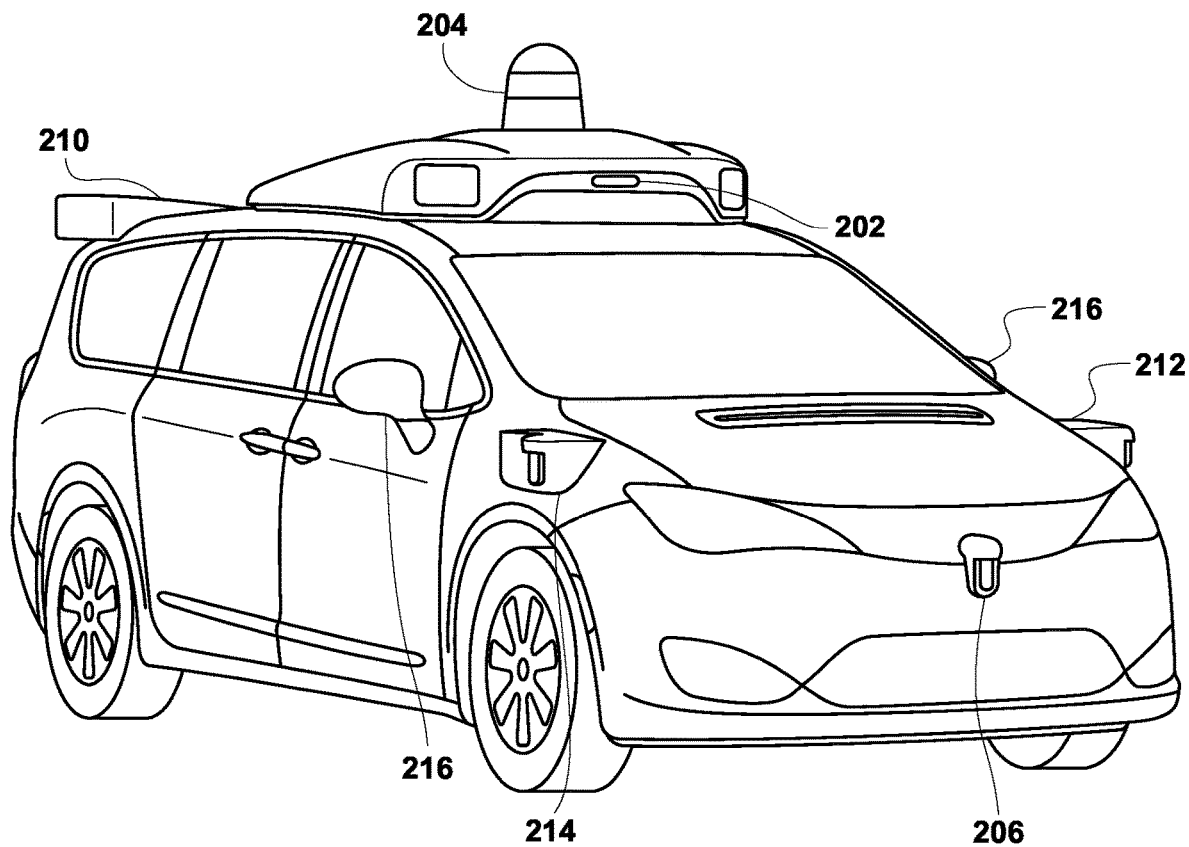
FIG. 2E is an illustration of a physical configuration of a vehicle, according to example embodiments.

Example methods and systems are contemplated herein. Any example embodiment or feature described herein is not necessarily to be construed as preferred or advantageous over other embodiments or features. Further, the example embodiments described herein are not meant to be limiting. It will be readily understood that certain aspects of the disclosed systems and methods can be arranged and combined in a wide variety of different configurations, all of which are contemplated herein. In addition, the particular arrangements shown in the figures should not be viewed as limiting. It should be understood that other embodiments might include more or less of each element shown in a given figure. Additionally, some of the illustrated elements may be combined or omitted. Yet further, an example embodiment may include elements that are not illustrated in the figures.

Lidar devices as described herein can include one or more light emitters and one or more detectors used for detecting light that is emitted by the one or more light emitters and reflected by one or more objects in an environment surrounding the lidar device. As an example, the surrounding environment could include an interior or exterior environment, such as an inside of a building or an outside of a building. Additionally or alternatively, the surrounding environment could include an interior of a vehicle. Still further, the surrounding environment could include a vicinity around and/or on a roadway. Examples of objects in the surrounding environment include, but are not limited to, other vehicles, traffic signs, pedestrians, bicyclists, roadway surfaces, buildings, and terrain. Additionally, the one or more light emitters could emit light into a local environment of the lidar itself. For example, light emitted from the one or more light emitters could interact with a housing of the lidar and/or surfaces or structures coupled to the lidar. In some cases, the lidar could be mounted to a vehicle, in which case the one or more light emitters could be configured to emit light that interacts with objects within a vicinity of the vehicle. Further, the light emitters could include optical fiber amplifiers, laser diodes, light-emitting diodes (LEDs), among other possibilities.

In electronic spinning assemblies, it is desirable to cool the components inside in order to prevent the assembly from overheating. One technique currently used to overcome the issue of overheating is to use an impeller to pull air through the electronic spinning assembly. However, this technique might not work with changing electronic spinning assembly designs. For example, blowing air might not adequately reach all of the areas that need to be cooled, such as heat sinks and camera arrays.

In example embodiments, a system or device can be used in electronic spinning assembly applications to draw air through the assembly to cool it. The device can draw air from below the assembly up into the electronic spinning assembly. In an example embodiment, the device could include a static ring base with evenly spaced vanes that help drive the path of air through the assembly. The vanes can be curved to help improve aerodynamics and increase air pressure. The static base can further include a plurality of air inlets in the center of the ring. A cavity can be disposed below the base to allow air to be sucked through the inlets and flow through the vanes.

The static base may be covered by a rotating vane cover. The vane cover can include duct inlets positioned above the vanes. The ducts may have outlets positioned near areas in the electronic spinning assembly that are to be cooled. The ducts (and their respective inlets and outlets) can be configured to spin with the spinning assembly while the vanes remain stationary. As the ducts spin with the rest of the assembly, air is pulled into the air inlets in the vane cover. The air travels around each vane into the duct inlets and gets pushed out the duct outlet. Exhaust air could then be vented out of the electronic spinning assembly.

The rotating cover may further include a plurality of narrow choke sections to increase air pressure. The chokes may be flat sections in the rotating vane cover. As the flat sections move across the stationary vanes, suction is created.

An example embodiment may include three ducts with outlets that are positioned near the three main heatsinks of the electronic spinning assembly. However, the number of ducts is controlled by the size of the assembly. In a scenario with multiple ducts, it can be desirable for the flow of two of the outlets to match so that they can equally cool respective areas of the electronic spinning assembly. The third duct may output a different airflow than the first two ducts.

Although the airflow that is output from each air duct may be different, the air flow across each respective duct will be uniform. For example, across the outlet of an air duct, the flow will be uniform, instead of one side of the outlet having a higher air flow than the other. This may be achieved using a fin stack and by the shape of the air duct. The ducts may be shaped so that they maximize air pressure and minimize loses through friction. For example, the ducts may not include any sharp turns, and may include a dense fin stack within them.

The following description and accompanying drawings will elucidate features of various example embodiments. The embodiments provided are by way of example, and are not intended to be limiting. As such, the dimensions of the drawings are not necessarily to scale.

Example systems within the scope of the present disclosure will now be described in greater detail. An example system may be implemented in or may take the form of an automobile. Additionally, an example system may also be implemented in or take the form of various vehicles, such as cars, trucks (e.g., pickup trucks, vans, tractors, and tractor trailers), motorcycles, buses, airplanes, helicopters, drones, lawn mowers, earth movers, boats, submarines, all-terrain vehicles, snowmobiles, aircraft, recreational vehicles, amusement park vehicles, farm equipment or vehicles, construction equipment or vehicles, warehouse equipment or vehicles, factory equipment or vehicles, trams, golf carts, trains, trolleys, sidewalk delivery vehicles, and robot devices. Other vehicles are possible as well. Further, in some embodiments, example systems might not include a vehicle.

Referring now to the figures, FIG. 1 is a functional block diagram illustrating example vehicle 100, which may be configured to operate fully or partially in an autonomous mode. More specifically, vehicle 100 may operate in an autonomous mode without human interaction through receiving control instructions from a computing system. As part of operating in the autonomous mode, vehicle 100 may use sensors to detect and possibly identify objects of the surrounding environment to enable safe navigation. Additionally, example vehicle 100 may operate in a partially autonomous (i.e., semi-autonomous) mode in which some functions of the vehicle 100 are controlled by a human driver of the vehicle 100 and some functions of the vehicle 100 are controlled by the computing system. For example, vehicle 100 may also include subsystems that enable the driver to control operations of vehicle 100 such as steering, acceleration, and braking, while the computing system performs assistive functions such as lane-departure warnings/lane-keeping assist or adaptive cruise control based on other objects (e.g., vehicles) in the surrounding environment.

As described herein, in a partially autonomous driving mode, even though the vehicle assists with one or more driving operations (e.g., steering, braking and/or accelerating to perform lane centering, adaptive cruise control, advanced driver assistance systems (ADAS), and emergency braking), the human driver is expected to be situationally aware of the vehicle's surroundings and supervise the assisted driving operations. Here, even though the vehicle may perform all driving tasks in certain situations, the human driver is expected to be responsible for taking control as needed.

Although, for brevity and conciseness, various systems and methods are described below in conjunction with autonomous vehicles, these or similar systems and methods can be used in various driver assistance systems that do not rise to the level of fully autonomous driving systems (i.e. partially autonomous driving systems). In the United States, the Society of Automotive Engineers (SAE) have defined different levels of automated driving operations to indicate how much, or how little, a vehicle controls the driving, although different organizations, in the United States or in other countries, may categorize the levels differently. More specifically, the disclosed systems and methods can be used in SAE Level 2 driver assistance systems that implement steering, braking, acceleration, lane centering, adaptive cruise control, etc., as well as other driver support. The disclosed systems and methods can be used in SAE Level 3 driving assistance systems capable of autonomous driving under limited (e.g., highway) conditions. Likewise, the disclosed systems and methods can be used in vehicles that use SAE Level 4 self-driving systems that operate autonomously under most regular driving situations and require only occasional attention of the human operator. In all such systems, accurate lane estimation can be performed automatically without a driver input or control (e.g., while the vehicle is in motion) and result in improved reliability of vehicle positioning and navigation and the overall safety of autonomous, semi-autonomous, and other driver assistance systems. As previously noted, in addition to the way in which SAE categorizes levels of automated driving operations, other organizations, in the United States or in other countries, may categorize levels of automated driving operations differently. Without limitation, the disclosed systems and methods herein can be used in driving assistance systems defined by these other organizations' levels of automated driving operations.

As shown in FIG. 1, vehicle 100 may include various subsystems, such as propulsion system 102, sensor system 104, control system 106, one or more peripherals 108, power supply 110, computer system 112 (which could also be referred to as a computing system) with data storage 114, and user interface 116. In other examples, vehicle 100 may include more or fewer subsystems, which can each include multiple elements. The subsystems and components of vehicle 100 may be interconnected in various ways. In addition, functions of vehicle 100 described herein can be divided into additional functional or physical components, or combined into fewer functional or physical components within embodiments. For instance, the control system 106 and the computer system 112 may be combined into a single system that operates the vehicle 100 in accordance with various operations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, an electric motor, steam engine, or Stirling engine, among other possible options. For instance, in some embodiments, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some embodiments, energy source 119 may include a combination of fuel tanks, batteries, capacitors, and/or flywheels.

Transmission 120 may transmit mechanical power from engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example embodiments. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, radar 126, lidar 128, camera 130, steering sensor 123, and throttle/brake sensor 125, among other possible sensors. In some embodiments, sensor system 104 may also include sensors configured to monitor internal systems of the vehicle 100 (e.g., $O_2$ monitor, fuel gauge, engine oil temperature, and brake wear).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar 126 may represent one or more systems configured to use radio signals to sense objects, including the speed and heading of the objects, within the surrounding environment of vehicle 100. As such, radar 126 may include antennas configured to transmit and receive radio signals. In some embodiments, radar 126 may correspond to a mountable radar configured to obtain measurements of the surrounding environment of vehicle 100.

Lidar 128 may include one or more laser sources, a laser scanner, and one or more detectors, among other system components, and may operate in a coherent mode (e.g., using heterodyne detection) or in an incoherent detection mode (i.e., time-of-flight mode). In some embodiments, the one or more detectors of the lidar 128 may include one or more photodetectors, which may be especially sensitive detectors (e.g., avalanche photodiodes). In some examples, such photodetectors may be capable of detecting single photons (e.g., single-photon avalanche diodes (SPADs)). Further, such photodetectors can be arranged (e.g., through an electrical connection in series) into an array (e.g., as in a silicon photomultiplier (SiPM)). In some examples, the one or more photodetectors are Geiger-mode operated devices and the lidar includes subcomponents designed for such Geiger-mode operation.

Camera 130 may include one or more devices (e.g., still camera, video camera, a thermal imaging camera, a stereo camera, and a night vision camera) configured to capture images of the surrounding environment of vehicle 100.

Steering sensor 123 may sense a steering angle of vehicle 100, which may involve measuring an angle of the steering wheel or measuring an electrical signal representative of the angle of the steering wheel. In some embodiments, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, an angle of a gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or a carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some embodiments, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some embodiments, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software (e.g., a general purpose processor such as a central processing unit (CPU), a specialized processor such as a graphical processing unit (GPU) or a tensor processing unit (TPU), an application-specific integrated circuit (ASIC), a field programmable gate array (FPGA), a volatile memory, a non-volatile memory, or one or more machine-learned models) operable to process and analyze images in an effort to determine objects that are in motion (e.g., other vehicles, pedestrians, bicyclists, or animals) and objects that are not in motion (e.g., traffic lights, roadway boundaries, speedbumps, or potholes). As such, computer vision system 140 may use object recognition, Structure From Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, interior microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as code-division multiple access (CDMA), evolution-data optimized (EVDO), global system for mobile communications (GSM)/general packet radio service (GPRS), or cellular communication, such as 4G worldwide interoperability for microwave access (WiMAX) or long-term evolution (LTE), or 5G. Alternatively, wireless communication system 146 may communicate with a wireless local area network (WLAN) using WIFI® or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some embodiments. For instance, power supply 110 may include one or more batteries configured to provide electrical power. Vehicle 100 may also use other types of power supplies. In an example embodiment, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory, computer-readable medium, such as data storage 114. In some embodiments, computer system 112 may represent a plurality of computing devices that may serve to control individual components or subsystems of vehicle 100 in a distributed fashion.

In some embodiments, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, or control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of a surrounding environment of vehicle 100 operating in an autonomous or semi-autonomous mode. The state of the surrounding environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar 126 and/or lidar 128, and/or some other environmental mapping, ranging, and/or positioning sensor system may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100 (i.e., wireless communication system 146, computer system 112, data storage 114, and user interface 116) as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A-2E show an example vehicle 200 (e.g., a fully autonomous vehicle or semi-autonomous vehicle) that can include some or all of the functions described in connection with vehicle 100 in reference to FIG. 1. Although vehicle 200 is illustrated in FIGS. 2A-2E as a van with side view mirrors for illustrative purposes, the present disclosure is not so limited. For instance, the vehicle 200 can represent a truck, a car, a semi-trailer truck, a motorcycle, a golf cart, an off-road vehicle, a farm vehicle, or any other vehicle that is described elsewhere herein (e.g., buses, boats, airplanes, helicopters, drones, lawn mowers, earth movers, submarines, all-terrain vehicles, snowmobiles, aircraft, recreational vehicles, amusement park vehicles, farm equipment, construction equipment or vehicles, warehouse equipment or vehicles, factory equipment or vehicles, trams, trains, trolleys, sidewalk delivery vehicles, and robot devices).

The example vehicle 200 may include one or more sensor systems 202, 204, 206, 208, 210, 212, 214, and 218. In some embodiments, sensor systems 202, 204, 206, 208, 210, 212, 214, and/or 218 could represent one or more optical systems (e.g. cameras), one or more lidars, one or more radars, one or more inertial sensors, one or more humidity sensors, one or more acoustic sensors (e.g., microphones or sonar devices), or one or more other sensors configured to sense information about an environment surrounding the vehicle 200. In other words, any sensor system now known or later created could be coupled to the vehicle 200 and/or could be utilized in conjunction with various operations of the vehicle 200. As an example, a lidar could be utilized in self-driving or other types of navigation, planning, perception, and/or mapping operations of the vehicle 200. In addition, sensor systems 202, 204, 206, 208, 210, 212, 214, and/or 218 could represent a combination of sensors described herein (e.g., one or more lidars and radars; one or more lidars and cameras; one or more cameras and radars; or one or more lidars, cameras, and radars).

Note that the number, location, and type of sensor systems (e.g., 202 and 204) depicted in FIGS. 2A-E are intended as a non-limiting example of the location, number, and type of such sensor systems of an autonomous or semi-autonomous vehicle. Alternative numbers, locations, types, and configurations of such sensors are possible (e.g., to comport with vehicle size, shape, aerodynamics, fuel economy, aesthetics, or other conditions, to reduce cost, or to adapt to specialized environmental or application circumstances). For example, the sensor systems (e.g., 202 and 204) could be disposed in various other locations on the vehicle (e.g., at location 216) and could have fields of view that correspond to internal and/or surrounding environments of the vehicle 200.

The sensor system 202 may be mounted atop the vehicle 200 and may include one or more sensors configured to detect information about an environment surrounding the vehicle 200, and output indications of the information. For example, sensor system 202 can include any combination of cameras, radars, lidars, inertial sensors, humidity sensors, and acoustic sensors (e.g., microphones or sonar devices). The sensor system 202 can include one or more movable mounts that could be operable to adjust the orientation of one or more sensors in the sensor system 202. In one embodiment, the movable mount could include a rotating platform that could scan sensors so as to obtain information from each direction around the vehicle 200. In another embodiment, the movable mount of the sensor system 202 could be movable in a scanning fashion within a particular range of angles and/or azimuths and/or elevations. The sensor system 202 could be mounted atop the roof of a car, although other mounting locations are possible.

Additionally, the sensors of sensor system 202 could be distributed in different locations and need not be collocated in a single location. Furthermore, each sensor of sensor system 202 can be configured to be moved or scanned independently of other sensors of sensor system 202. Additionally or alternatively, multiple sensors may be mounted at one or more of the sensor locations 202, 204, 206, 208, 210, 212, 214, and/or 218. For example, there may be two lidar devices mounted at a sensor location and/or there may be one lidar device and one radar mounted at a sensor location.

The one or more sensor systems 202, 204, 206, 208, 210, 212, 214, and/or 218 could include one or more lidar devices. For example, the lidar devices could include a plurality of light-emitter devices arranged over a range of angles with respect to a given plane (e.g., the x-y plane). For example, one or more of the sensor systems 202, 204, 206, 208, 210, 212, 214, and/or 218 may be configured to rotate or pivot about an axis (e.g., the z-axis) perpendicular to the given plane so as to illuminate an environment surrounding the vehicle 200 with light pulses. Based on detecting various aspects of reflected light pulses (e.g., the elapsed time of flight, polarization, or intensity), information about the surrounding environment may be determined.

In an example embodiment, sensor systems 202, 204, 206, 208, 210, 212, 214, and/or 218 may be configured to provide respective point cloud information that may relate to physical objects within the surrounding environment of the vehicle 200. While vehicle 200 and sensor systems 202, 204, 206, 208, 210, 212, 214, and 218 are illustrated as including certain features, it will be understood that other types of sensor systems are contemplated within the scope of the present disclosure. Further, the example vehicle 200 can include any of the components described in connection with vehicle 100 of FIG. 1.

In an example configuration, one or more radars can be located on vehicle 200. Similar to radar 126 described above, the one or more radars may include antennas configured to transmit and receive radio waves (e.g., electromagnetic waves having frequencies between 30 Hz and 300 GHz). Such radio waves may be used to determine the distance to and/or velocity of one or more objects in the surrounding environment of the vehicle 200. For example, one or more sensor systems 202, 204, 206, 208, 210, 212, 214, and/or 218 could include one or more radars. In some examples, one or more radars can be located near the rear of the vehicle 200 (e.g., sensor systems 208 and 210), to actively scan the environment near the back of the vehicle 200 for the presence of radio-reflective objects. Similarly, one or more radars can be located near the front of the vehicle 200 (e.g., sensor systems 212 or 214) to actively scan the environment near the front of the vehicle 200. A radar can be situated, for example, in a location suitable to illuminate a region including a forward-moving path of the vehicle 200 without occlusion by other features of the vehicle 200. For example, a radar can be embedded in and/or mounted in or near the front bumper, front headlights, cowl, and/or hood, etc. Furthermore, one or more additional radars can be located to actively scan the side and/or rear of the vehicle 200 for the presence of radio-reflective objects, such as by including such devices in or near the rear bumper, side panels, rocker panels, and/or undercarriage, etc.

The vehicle 200 can include one or more cameras. For example, the one or more sensor systems 202, 204, 206, 208, 210, 212, 214, and/or 218 could include one or more cameras. The camera can be a photosensitive instrument, such as a still camera, a video camera, a thermal imaging camera, a stereo camera, a night vision camera, etc., that is configured to capture a plurality of images of the surrounding environment of the vehicle 200. To this end, the camera can be configured to detect visible light, and can additionally or alternatively be configured to detect light from other portions of the spectrum, such as infrared or ultraviolet light. The camera can be a two-dimensional detector, and can optionally have a three-dimensional spatial range of sensitivity. In some embodiments, the camera can include, for example, a range detector configured to generate a two-dimensional image indicating distance from the camera to a number of points in the surrounding environment. To this end, the camera may use one or more range detecting techniques. For example, the camera can provide range information by using a structured light technique in which the vehicle 200 illuminates an object in the surrounding environment with a predetermined light pattern, such as a grid or checkerboard pattern and uses the camera to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements. In some examples, the camera can be mounted inside a front windshield of the vehicle 200. Specifically, the camera can be situated to capture images from a forward-looking view with respect to the orientation of the vehicle 200. Other mounting locations and viewing angles of the camera can also be used, either inside or outside the vehicle 200. Further, the camera can have associated optics operable to provide an adjustable field of view. Still further, the camera can be mounted to vehicle 200 with a movable mount to vary a pointing angle of the camera, such as via a pan/tilt mechanism.

The vehicle 200 may also include one or more acoustic sensors (e.g., one or more of the sensor systems 202, 204, 206, 208, 210, 212, 214, 216, 218 may include one or more acoustic sensors) used to sense a surrounding environment of vehicle 200. Acoustic sensors may include microphones (e.g., piezoelectric microphones, condenser microphones, ribbon microphones, or microelectromechanical systems (MEMS) microphones) used to sense acoustic waves (i.e., pressure differentials) in a fluid (e.g., air) of the environment surrounding the vehicle 200. Such acoustic sensors may be used to identify sounds in the surrounding environment (e.g., sirens, human speech, animal sounds, or alarms) upon which control strategy for vehicle 200 may be based. For example, if the acoustic sensor detects a siren (e.g., an ambulatory siren or a fire engine siren), vehicle 200 may slow down and/or navigate to the edge of a roadway.

Although not shown in FIGS. 2A-2E, the vehicle 200 can include a wireless communication system (e.g., similar to the wireless communication system 146 of FIG. 1 and/or in addition to the wireless communication system 146 of FIG. 1). The wireless communication system may include wireless transmitters and receivers that could be configured to communicate with devices external or internal to the vehicle 200. Specifically, the wireless communication system could include transceivers configured to communicate with other vehicles and/or computing devices, for instance, in a vehicular communication system or a roadway station. Examples of such vehicular communication systems include DSRC, radio frequency identification (RFID), and other proposed communication standards directed towards intelligent transport systems.

The vehicle 200 may include one or more other components in addition to or instead of those shown. The additional components may include electrical or mechanical functionality.

A control system of the vehicle 200 may be configured to control the vehicle 200 in accordance with a control strategy from among multiple possible control strategies. The control system may be configured to receive information from sensors coupled to the vehicle 200 (on or off the vehicle 200), modify the control strategy (and an associated driving behavior) based on the information, and control the vehicle 200 in accordance with the modified control strategy. The control system further may be configured to monitor the information received from the sensors, and continuously evaluate driving conditions; and also may be configured to modify the control strategy and driving behavior based on changes in the driving conditions. For example, a route taken by a vehicle from one destination to another may be modified based on driving conditions. Additionally or alternatively, the velocity, acceleration, turn angle, follow distance (i.e., distance to a vehicle ahead of the present vehicle), lane selection, etc. could all be modified in response to changes in the driving conditions.

Figure 3:
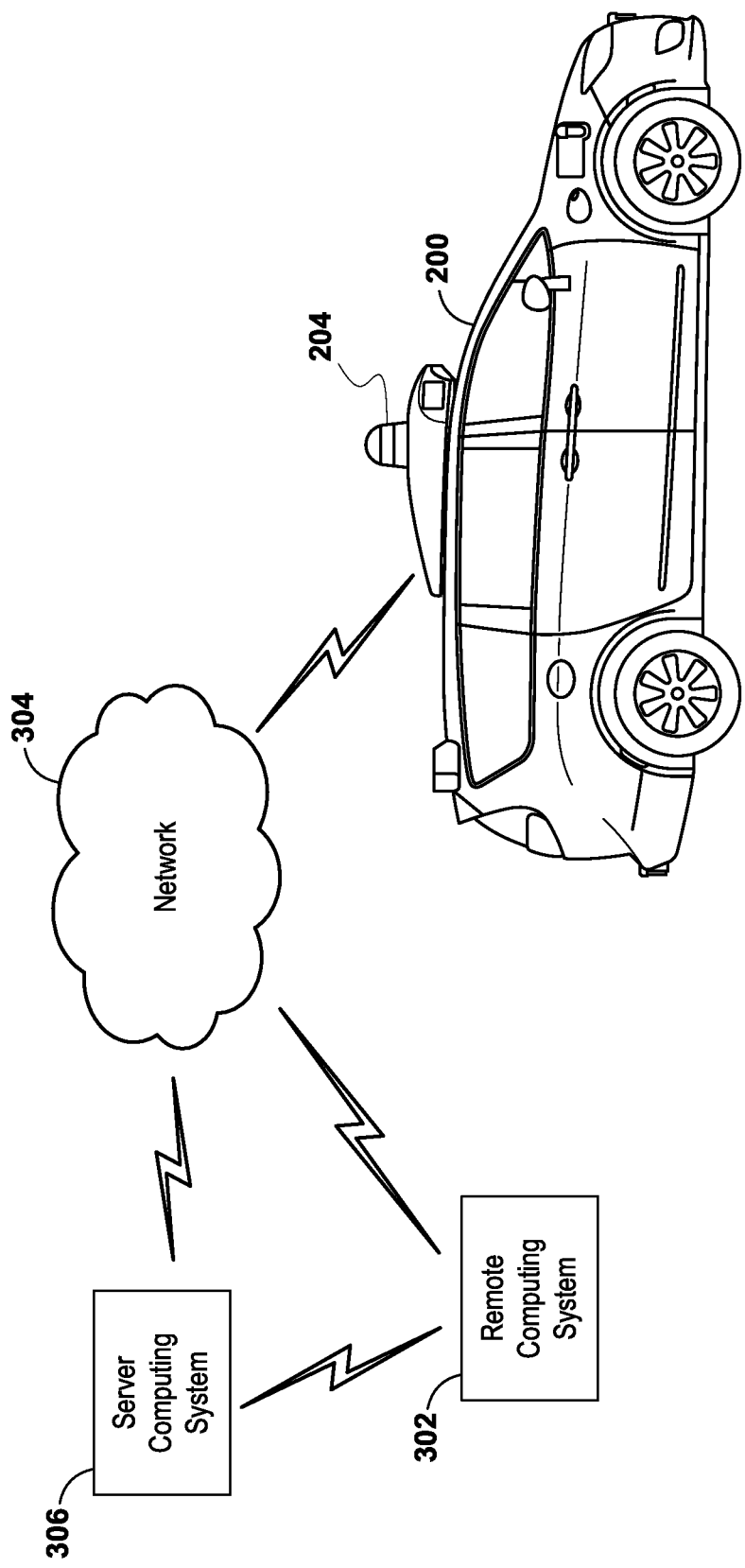
FIG. 3 is a conceptual illustration of wireless communication between various computing systems related to an autonomous or semi-autonomous vehicle, according to example embodiments.

FIG. 3 is a conceptual illustration of wireless communication between various computing systems related to an autonomous or semi-autonomous vehicle, according to example embodiments. In particular, wireless communication may occur between remote computing system 302 and vehicle 200 via network 304. Wireless communication may also occur between server computing system 306 and remote computing system 302, and between server computing system 306 and vehicle 200.

Vehicle 200 can correspond to various types of vehicles capable of transporting passengers or objects between locations, and may take the form of any one or more of the vehicles discussed above. In some instances, vehicle 200 may operate in an autonomous or semi-autonomous mode that enables a control system to safely navigate vehicle 200 between destinations using sensor measurements. When operating in an autonomous or semi-autonomous mode, vehicle 200 may navigate with or without passengers. As a result, vehicle 200 may pick up and drop off passengers between desired destinations.

Remote computing system 302 may represent any type of device related to remote assistance techniques, including but not limited to those described herein. Within examples, remote computing system 302 may represent any type of device configured to (i) receive information related to vehicle 200, (ii) provide an interface through which a human operator can in turn perceive the information and input a response related to the information, and (iii) transmit the response to vehicle 200 or to other devices. Remote computing system 302 may take various forms, such as a workstation, a desktop computer, a laptop, a tablet, a mobile phone (e.g., a smart phone), and/or a server. In some examples, remote computing system 302 may include multiple computing devices operating together in a network configuration.

Remote computing system 302 may include one or more subsystems and components similar or identical to the subsystems and components of vehicle 200. At a minimum, remote computing system 302 may include a processor configured for performing various operations described herein. In some embodiments, remote computing system 302 may also include a user interface that includes input/output devices, such as a touchscreen and a speaker. Other examples are possible as well.

Network 304 represents infrastructure that enables wireless communication between remote computing system 302 and vehicle 200. Network 304 also enables wireless communication between server computing system 306 and remote computing system 302, and between server computing system 306 and vehicle 200.

The position of remote computing system 302 can vary within examples. For instance, remote computing system 302 may have a remote position from vehicle 200 that has a wireless communication via network 304. In another example, remote computing system 302 may correspond to a computing device within vehicle 200 that is separate from vehicle 200, but with which a human operator can interact while a passenger or driver of vehicle 200. In some examples, remote computing system 302 may be a computing device with a touchscreen operable by the passenger of vehicle 200.

In some embodiments, operations described herein that are performed by remote computing system 302 may be additionally or alternatively performed by vehicle 200 (i.e., by any system(s) or subsystem(s) of vehicle 200). In other words, vehicle 200 may be configured to provide a remote assistance mechanism with which a driver or passenger of the vehicle can interact.

Server computing system 306 may be configured to wirelessly communicate with remote computing system 302 and vehicle 200 via network 304 (or perhaps directly with remote computing system 302 and/or vehicle 200). Server computing system 306 may represent any computing device configured to receive, store, determine, and/or send information relating to vehicle 200 and the remote assistance thereof. As such, server computing system 306 may be configured to perform any operation(s), or portions of such operation(s), that is/are described herein as performed by remote computing system 302 and/or vehicle 200. Some embodiments of wireless communication related to remote assistance may utilize server computing system 306, while others may not.

Server computing system 306 may include one or more subsystems and components similar or identical to the subsystems and components of remote computing system 302 and/or vehicle 200, such as a processor configured for performing various operations described herein, and a wireless communication interface for receiving information from, and providing information to, remote computing system 302 and vehicle 200.

The various systems described above may perform various operations. These operations and related features will now be described.

In line with the discussion above, a computing system (e.g., remote computing system 302, server computing system 306, or a computing system local to vehicle 200) may operate to use a camera to capture images of the surrounding environment of an autonomous or semi-autonomous vehicle. In general, at least one computing system will be able to analyze the images and possibly control the autonomous or semi-autonomous vehicle.

In some embodiments, to facilitate autonomous or semi-autonomous operation, a vehicle (e.g., vehicle 200) may receive data representing objects in an environment surrounding the vehicle (also referred to herein as "environment data") in a variety of ways. A sensor system on the vehicle may provide the environment data representing objects of the surrounding environment. For example, the vehicle may have various sensors, including a camera, a radar, a lidar, a microphone, a radio unit, and other sensors. Each of these sensors may communicate environment data to a processor in the vehicle about information each respective sensor receives.

In one example, a camera may be configured to capture still images and/or video. In some embodiments, the vehicle may have more than one camera positioned in different orientations. Also, in some embodiments, the camera may be able to move to capture images and/or video in different directions. The camera may be configured to store captured images and video to a memory for later processing by a processing system of the vehicle. The captured images and/or video may be the environment data. Further, the camera may include an image sensor as described herein.

In another example, a radar may be configured to transmit an electromagnetic signal that will be reflected by various objects near the vehicle, and then capture electromagnetic signals that reflect off the objects. The captured reflected electromagnetic signals may enable the radar (or processing system) to make various determinations about objects that reflected the electromagnetic signal. For example, the distances to and positions of various reflecting objects may be determined. In some embodiments, the vehicle may have more than one radar in different orientations. The radar may be configured to store captured information to a memory for later processing by a processing system of the vehicle. The information captured by the radar may be environment data.

In another example, a lidar may be configured to transmit an electromagnetic signal (e.g., infrared light, such as that from a gas or diode laser, or other possible light source) that will be reflected by target objects near the vehicle. The lidar may be able to capture the reflected electromagnetic (e.g., infrared light) signals. The captured reflected electromagnetic signals may enable the range-finding system (or processing system) to determine a range to various objects. The lidar may also be able to determine a velocity or speed of target objects and store it as environment data.

Additionally, in an example, a microphone may be configured to capture audio of the environment surrounding the vehicle. Sounds captured by the microphone may include emergency vehicle sirens and the sounds of other vehicles. For example, the microphone may capture the sound of the siren of an ambulance, fire engine, or police vehicle. A processing system may be able to identify that the captured audio signal is indicative of an emergency vehicle. In another example, the microphone may capture the sound of an exhaust of another vehicle, such as that from a motorcycle. A processing system may be able to identify that the captured audio signal is indicative of a motorcycle. The data captured by the microphone may form a portion of the environment data.

In yet another example, the radio unit may be configured to transmit an electromagnetic signal that may take the form of a Bluetooth signal, 802.11 signal, and/or other radio technology signal. The first electromagnetic radiation signal may be transmitted via one or more antennas located in a radio unit. Further, the first electromagnetic radiation signal may be transmitted with one of many different radio-signaling modes. However, in some embodiments it is desirable to transmit the first electromagnetic radiation signal with a signaling mode that requests a response from devices located near the autonomous or semi-autonomous vehicle. The processing system may be able to detect nearby devices based on the responses communicated back to the radio unit and use this communicated information as a portion of the environment data.

In some embodiments, the processing system may be able to combine information from the various sensors in order to make further determinations of the surrounding environment of the vehicle. For example, the processing system may combine data from both radar information and a captured image to determine if another vehicle or pedestrian is in front of the autonomous or semi-autonomous vehicle. In other embodiments, other combinations of sensor data may be used by the processing system to make determinations about the surrounding environment.

While operating in an autonomous mode (or semi-autonomous mode), the vehicle may control its operation with little-to-no human input. For example, a human-operator may enter an address into the vehicle and the vehicle may then be able to drive, without further input from the human (e.g., the human does not have to steer or touch the brake/gas pedals), to the specified destination. Further, while the vehicle is operating autonomously or semi-autonomously, the sensor system may be receiving environment data. The processing system of the vehicle may alter the control of the vehicle based on environment data received from the various sensors. In some examples, the vehicle may alter a velocity of the vehicle in response to environment data from the various sensors. The vehicle may change velocity in order to avoid obstacles, obey traffic laws, etc. When a processing system in the vehicle identifies objects near the vehicle, the vehicle may be able to change velocity, or alter the movement in another way.

When the vehicle detects an object but is not highly confident in the detection of the object, the vehicle can request a human operator (or a more powerful computer) to perform one or more remote assistance tasks, such as (i) confirm whether the object is in fact present in the surrounding environment (e.g., if there is actually a stop sign or if there is actually no stop sign present), (ii) confirm whether the vehicle's identification of the object is correct, (iii) correct the identification if the identification was incorrect, and/or (iv) provide a supplemental instruction (or modify a present instruction) for the autonomous or semi-autonomous vehicle. Remote assistance tasks may also include the human operator providing an instruction to control operation of the vehicle (e.g., instruct the vehicle to stop at a stop sign if the human operator determines that the object is a stop sign), although in some scenarios, the vehicle itself may control its own operation based on the human operator's feedback related to the identification of the object.

To facilitate this, the vehicle may analyze the environment data representing objects of the surrounding environment to determine at least one object having a detection confidence below a threshold. A processor in the vehicle may be configured to detect various objects of the surrounding environment based on environment data from various sensors. For example, in one embodiment, the processor may be configured to detect objects that may be important for the vehicle to recognize. Such objects may include pedestrians, bicyclists, street signs, other vehicles, indicator signals on other vehicles, and other various objects detected in the captured environment data.

The detection confidence may be indicative of a likelihood that the determined object is correctly identified in the surrounding environment, or is present in the surrounding environment. For example, the processor may perform object detection of objects within image data in the received environment data, and determine that at least one object has the detection confidence below the threshold based on being unable to identify the object with a detection confidence above the threshold. If a result of an object detection or object recognition of the object is inconclusive, then the detection confidence may be low or below the set threshold. The vehicle may detect objects of the surrounding environment in various ways depending on the source of the environment data. In some embodiments, the environment data may come from a camera and be image or video data. In other embodiments, the environment data may come from a lidar. The vehicle may analyze the captured image or video data to identify objects in the image or video data. The methods and apparatuses may be configured to monitor image and/or video data for the presence of objects of the surrounding environment. In other embodiments, the environment data may be radar, audio, or other data. The vehicle may be configured to identify objects of the surrounding environment based on the radar, audio, or other data.

In some embodiments, the techniques the vehicle uses to detect objects may be based on a set of known data. For example, data related to environmental objects may be stored to a memory located in the vehicle. The vehicle may compare received data to the stored data to determine objects. In other embodiments, the vehicle may be configured to determine objects based on the context of the data. For example, street signs related to construction may generally have an orange color. Accordingly, the vehicle may be configured to detect objects that are orange, and located near the side of roadways as construction-related street signs. Additionally, when the processing system of the vehicle detects objects in the captured data, it also may calculate a confidence for each object.

Further, the vehicle may also have a confidence threshold. The confidence threshold may vary depending on the type of object being detected. For example, the confidence threshold may be lower for an object that may require a quick responsive action from the vehicle, such as brake lights on another vehicle. However, in other embodiments, the confidence threshold may be the same for all detected objects. When the confidence associated with a detected object is greater than the confidence threshold, the vehicle may assume the object was correctly recognized and responsively adjust the control of the vehicle based on that assumption.

When the confidence associated with a detected object is less than the confidence threshold, the actions that the vehicle takes may vary. In some embodiments, the vehicle may react as if the detected object is present despite the low confidence level. In other embodiments, the vehicle may react as if the detected object is not present.

When the vehicle detects an object of the surrounding environment, it may also calculate a confidence associated with the specific detected object. The confidence may be calculated in various ways depending on the embodiment. In one example, when detecting objects of the surrounding environment, the vehicle may compare environment data to predetermined data relating to known objects. The closer the match between the environment data and the predetermined data, the higher the confidence. In other embodiments, the vehicle may use mathematical analysis of the environment data to determine the confidence associated with the objects.

In response to determining that an object has a detection confidence that is below the threshold, the vehicle may transmit, to the remote computing system, a request for remote assistance with the identification of the object. As discussed above, the remote computing system may take various forms. For example, the remote computing system may be a computing device within the vehicle that is separate from the vehicle, but with which a human operator can interact while a passenger or driver of the vehicle, such as a touchscreen interface for displaying remote assistance information. Additionally or alternatively, as another example, the remote computing system may be a remote computer terminal or other device that is located at a location that is not near the vehicle.

The request for remote assistance may include the environment data that includes the object, such as image data, audio data, etc. The vehicle may transmit the environment data to the remote computing system over a network (e.g., network 304), and in some embodiments, via a server (e.g., server computing system 306). The human operator of the remote computing system may in turn use the environment data as a basis for responding to the request.

In some embodiments, when the object is detected as having a confidence below the confidence threshold, the object may be given a preliminary identification, and the vehicle may be configured to adjust the operation of the vehicle in response to the preliminary identification. Such an adjustment of operation may take the form of stopping the vehicle, switching the vehicle to a human-controlled mode, changing a velocity of the vehicle (e.g., a speed and/or direction), among other possible adjustments.

In other embodiments, even if the vehicle detects an object having a confidence that meets or exceeds the threshold, the vehicle may operate in accordance with the detected object (e.g., come to a stop if the object is identified with high confidence as a stop sign), but may be configured to request remote assistance at the same time as (or at a later time from) when the vehicle operates in accordance with the detected object.

FIG. 4A is a block diagram of a system, according to example embodiments. In particular, FIG. 4A shows a system 400 that includes a system controller 402, a lidar device 410, a plurality of sensors 412, and a plurality of controllable components 414. System controller 402 includes processor(s) 404, a memory 406, and instructions 408 stored on the memory 406 and executable by the processor(s) 404 to perform functions.

The processor(s) 404 can include one or more processors, such as one or more general-purpose microprocessors (e.g., having a single core or multiple cores) and/or one or more special purpose microprocessors. The one or more processors may include, for instance, one or more central processing units (CPUs), one or more microcontrollers, one or more graphical processing units (GPUs), one or more tensor processing units (TPUs), one or more ASICs, and/or one or more field-programmable gate arrays (FPGAs). Other types of processors, computers, or devices configured to carry out software instructions are also contemplated herein.

The memory 406 may include a computer-readable medium, such as a non-transitory, computer-readable medium, which may include without limitation, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The lidar device 410, described further below, includes a plurality of light emitters configured to emit light (e.g., in light pulses) and one or more light detectors configured to detect light (e.g., reflected portions of the light pulses). The lidar device 410 may generate three-dimensional (3D) point cloud data from outputs of the light detector(s), and provide the 3D point cloud data to the system controller 402. The system controller 402, in turn, may perform operations on the 3D point cloud data to determine the characteristics of a surrounding environment (e.g., relative positions of objects within a surrounding environment, edge detection, object detection, or proximity sensing).

Similarly, the system controller 402 may use outputs from the plurality of sensors 412 to determine the characteristics of the system 400 and/or characteristics of the surrounding environment. For example, the sensors 412 may include one or more of a GPS, an IMU, an image capture device (e.g., a camera), a light sensor, a heat sensor, and other sensors indicative of parameters relevant to the system 400 and/or the surrounding environment. The lidar device 410 is depicted as separate from the sensors 412 for purposes of example, and may be considered as part of or as the sensors 412 in some examples.

Based on characteristics of the system 400 and/or the surrounding environment determined by the system controller 402 based on the outputs from the lidar device 410 and the sensors 412, the system controller 402 may control the controllable components 414 to perform one or more actions. For example, the system 400 may correspond to a vehicle, in which case the controllable components 414 may include a braking system, a turning system, and/or an accelerating system of the vehicle, and the system controller 402 may change aspects of these controllable components based on characteristics determined from the lidar device 410 and/or sensors 412 (e.g., when the system controller 402 controls the vehicle in an autonomous or semi-autonomous mode). Within examples, the lidar device 410 and the sensors 412 are also controllable by the system controller 402.

Figure 4B:
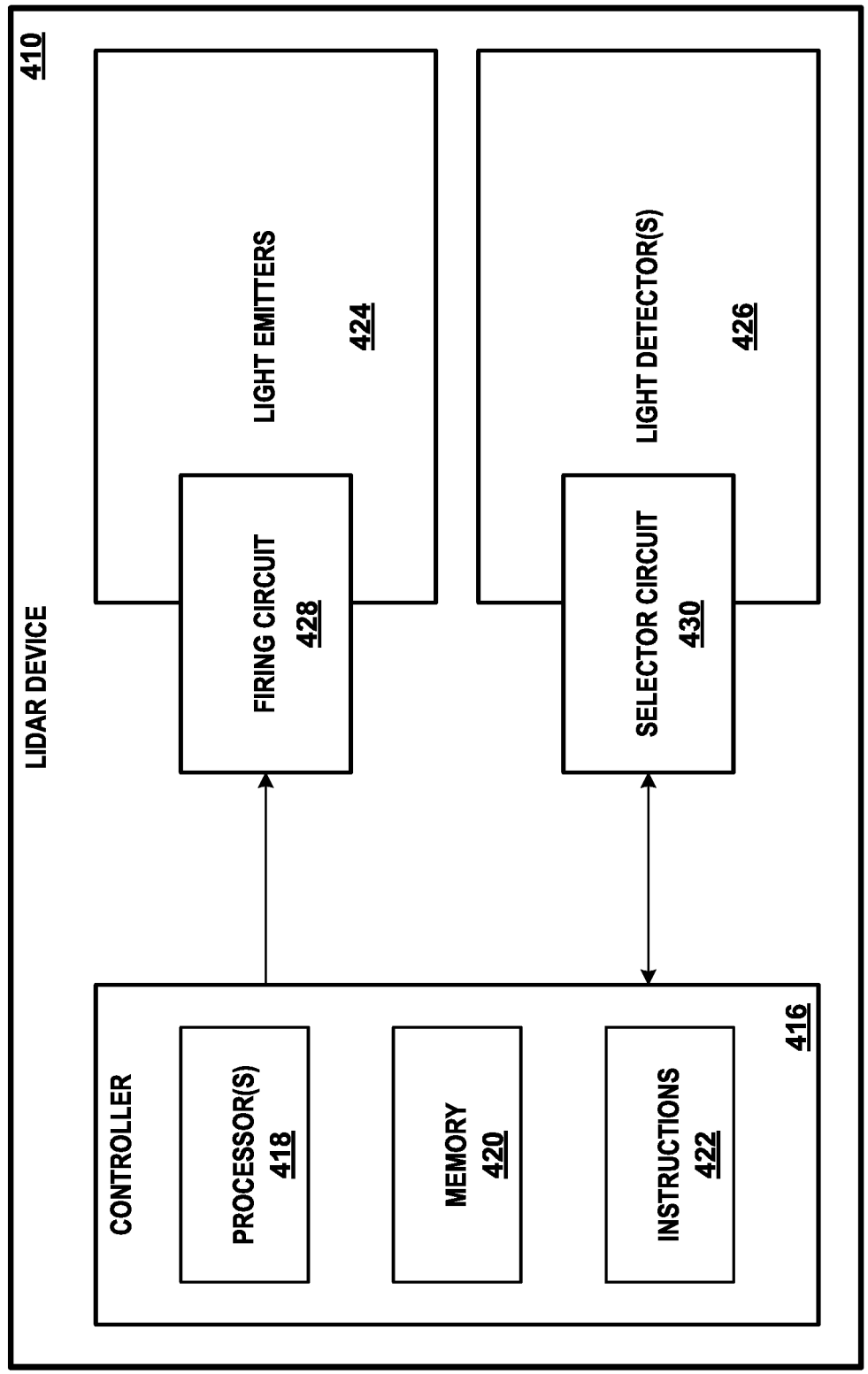
FIG. 4B is a block diagram of a lidar device, according to example embodiments.

FIG. 4B is a block diagram of a lidar device, according to an example embodiment. In particular, FIG. 4B shows a lidar device 410, having a controller 416 configured to control a plurality of light emitters 424 and one or more light detector(s), e.g., a plurality of light detectors 426. The lidar device 410 further includes a firing circuit 428 configured to select and provide power to respective light emitters of the plurality of light emitters 424 and may include a selector circuit 430 configured to select respective light detectors of the plurality of light detectors 426. The controller 416 includes processor(s) 418, a memory 420, and instructions 422 stored on the memory 420.

Similar to processor(s) 404, the processor(s) 418 can include one or more processors, such as one or more general-purpose microprocessors and/or one or more special purpose microprocessors. The one or more processors may include, for instance, one or more CPUs, one or more microcontrollers, one or more GPUs, one or more TPUs, one or more ASICs, and/or one or more FPGAs. Other types of processors, computers, or devices configured to carry out software instructions are also contemplated herein.

Similar to memory 406, the memory 420 may include a computer-readable medium, such as a non-transitory, computer-readable medium, such as, but not limited to, ROM, PROM, EPROM, EEPROM, non-volatile random-access memory (e.g., flash memory), a SSD, a HDD, a CD, a DVD, a digital tape, R/W CDs, R/W DVDs, etc.

The instructions 422 are stored on memory 420 and executable by the processor(s) 418 to perform functions related to controlling the firing circuit 428 and the selector circuit 430, for generating 3D point cloud data, and for processing the 3D point cloud data (or perhaps facilitating processing the 3D point cloud data by another computing device, such as the system controller 402).

The controller 416 can determine 3D point cloud data by using the light emitters 424 to emit pulses of light. A time of emission is established for each light emitter and a relative location at the time of emission is also tracked. Aspects of a surrounding environment of the lidar device 410, such as various objects, reflect the pulses of light. For example, when the lidar device 410 is in a surrounding environment that includes a road, such objects may include vehicles, signs, pedestrians, road surfaces, or construction cones. Some objects may be more reflective than others, such that an intensity of reflected light may indicate a type of object that reflects the light pulses. Further, surfaces of objects may be at different positions relative to the lidar device 410, and thus take more or less time to reflect portions of light pulses back to the lidar device 410. Accordingly, the controller 416 may track a detection time at which a reflected light pulse is detected by a light detector and a relative position of the light detector at the detection time. By measuring time differences between emission times and detection times, the controller 416 can determine how far the light pulses travel prior to being received, and thus a relative distance of a corresponding object. By tracking relative positions at the emission times and detection times the controller 416 can determine an orientation of the light pulse and reflected light pulse relative to the lidar device 410, and thus a relative orientation of the object. By tracking intensities of received light pulses, the controller 416 can determine how reflective the object is. The 3D point cloud data determined based on this information may thus indicate relative positions of detected reflected light pulses (e.g., within a coordinate system, such as a Cartesian coordinate system) and intensities of each reflected light pulse.

The firing circuit 428 is used for selecting light emitters for emitting light pulses. The selector circuit 430 similarly is used for sampling outputs from light detectors.

Figure 5A:
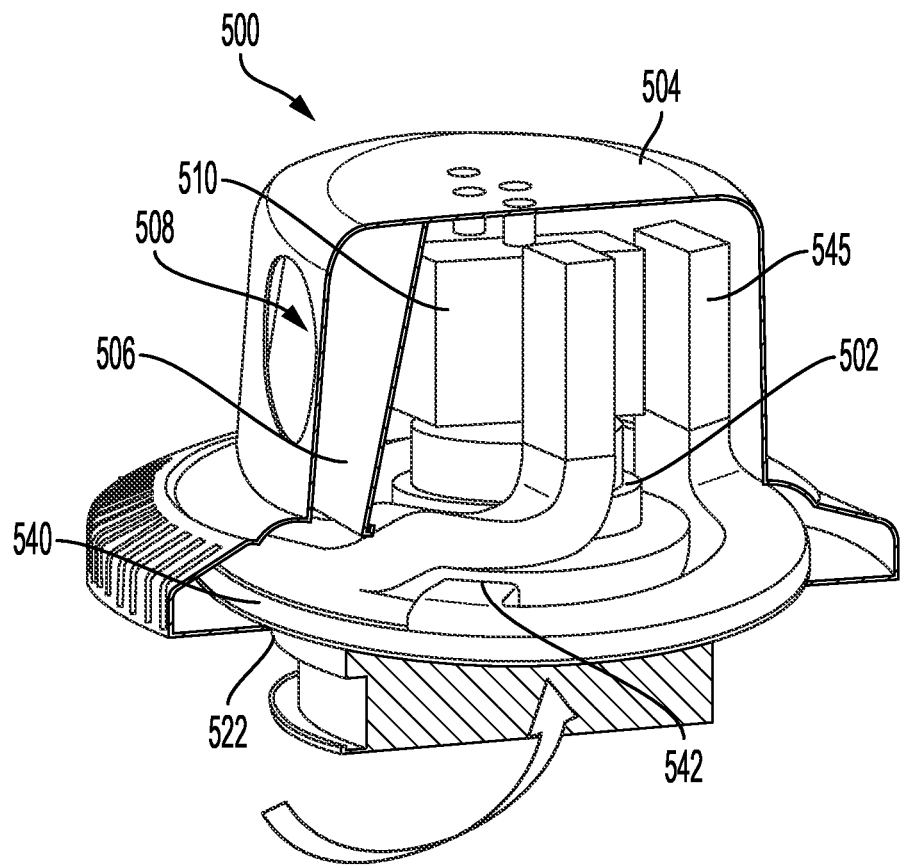
FIG. 5A is an illustration of an electronic spinning assembly and cooling device in a housing, according to example embodiments.

FIG. 5A illustrates an example embodiment of a device 500 for air-cooling an electronic spinning assembly. The device 500 can include a plurality of vanes coupled to a static base 522. A vane cover 540 can be rotatably coupled to the static base 522. In an example embodiment, the vane cover 540 can at least partially enclose the plurality of vanes. The vane cover 540 can also be coupled to an electronic spinning assembly 502 and can be configured to rotate with the spinning assembly 502. For example, the vane cover 540 can be connected to a motor that is spinning the electronic spinning assembly 502, the vane cover 540 could be connected directly to the electronic spinning assembly 502, or the vane cover 540 could be connected to the housing 504 which is in turn connected to the electronic spinning assembly 502. In the last example, the electronic spinning assembly 502 may be spun by a motor.

The vane cover 540 can further include at least one air inlet 542 configured to act as an air intake for an airflow. The air inlet 542 can be in the center of the ring that is created by the vane cover 540 and static base 522. The vane cover 540 can further include at least one air duct 545 extending from the vane cover 540 configured to direct the airflow, and at least one choke point disposed in the cover, wherein the at least one choke point is configured to increase a pressure of the airflow.

In an example embodiment, as the vane cover 540 rotates with the electronic spinning assembly 502, air can be drawn from below the electronic spinning assembly 502 up into the assembly and through the at least one air duct 545 to cool specific components. The plurality of vanes, which are static, slow down the air inside of the vane cover 540. This means that air is moving relative to the rotating vane cover 540 and consequently is forced through the at least one air duct 545. The design may be optimized to minimize airflow restriction.

The device 500 can further include a housing 504. In an example embodiment, the housing 504 may enclose (e.g., partially or wholly) one or more components of the device 500. For example, the housing 504 may enclose the static base 522, the plurality of vanes, the vane cover 540, and the electronic spinning assembly 502. The housing 504 can keep the electronic spinning assembly 502 free from any water, dirt, or other debris, and otherwise protect the electronic spinning assembly. The airflow can be vented out of the housing 504 radially through the housing. Additionally or alternatively, the housing 504 may enclose one or more sensors. For example, housing 504 may enclose any combination of one or more of the following sensors: a thermometer, a barometer, a hygrometer, a radar, a lidar device, a GPS unit, a camera, a microphone, sonar sensor, etc.

In an example embodiment, the electronic assembly 502 includes a sensor 510. The sensor 510 could be one or more lidar devices previously described, for example lidar device 410. Additionally or alternatively, the sensor 510 and/or the electronic assembly 502 could include any combination of one or more of any other type of sensor previously described (e.g., a GPS, an IMU, an image capture device (e.g., a camera), a radar, a light sensor, a heat sensor, a microphone, a sonar sensor, a thermometer, a barometer, a hygrometer, and/or other sensors indicative of parameters relevant to the surrounding environment).

The housing 504 can include a wall 506 with an aperture or a window 508, which can permit at least one sensor to sense one or more aspects of an environment surrounding the device 500. For example, the aperture 508 may provide a surface that mechanically protects the components of sensor 510 without optically isolating sensor 510 or other sensors from the surrounding environment (e.g., thereby still permitting sensor 510 or other sensor in the sensor unit 400 to sense the one or more aspects of the surrounding environment). In other words, signals emitted by sensor 510 may be able to pass through the aperture or window 508 to and from the surrounding environment. It is understood that the terms "optical", "optically", etc., as used herein, are not meant to limit the embodiments to applications that use visible wavelengths. In various embodiments, both explicitly and implicitly contemplated herein, other wavelength ranges may be used. For example, electromagnetic radiation having an infrared wavelength (e.g., 1.55 µm) may be transmitted.

In some embodiments, the aperture or window 508 may be covered with one or more components. For example, the aperture or window 508 may be covered with a window coating, such as an AR coating or a hydrophobic coating, which may help prevent water from occluding the aperture or window 508. Additionally or alternatively, the aperture or window 508 may be covered by a filter (e.g., a chromatic filter or a neutral-density filter) that absorbs (and/or reflects) at least some wavelengths that are not emitted by sensor 510 (e.g., light that is not within a wavelength range emitted by light emitters of sensor 510). In some embodiments, the aperture or window 508, themselves, may be fabricated from black glass so as to effectively transmit light of wavelengths emitted by sensor 510 (e.g., infrared wavelengths) while blocking transmission of other wavelengths (e.g., wavelengths in the visible spectrum).

In some embodiments, device 500 may include one or multiple radar units previously described, for example radar 126. For instance, the radar unit or units may include one or more radiating antennas that can transmit electromagnetic energy as radar signals into the environment and one or more radiating antennas that can receive electromagnetic energy reflected off surfaces in the environment. The arrangement of the antennas can vary within examples and may include, for example, one or multiple linear antenna arrays, planar arrays, or other arrangements. In some instances, the radar unit(s) can be protected via one or multiple radomes that each allow signal transmission and reception while also providing protection to the radar unit(s). The radomes could include any of the properties previously described with respect to the aperture or window 508.

Figure 5B:
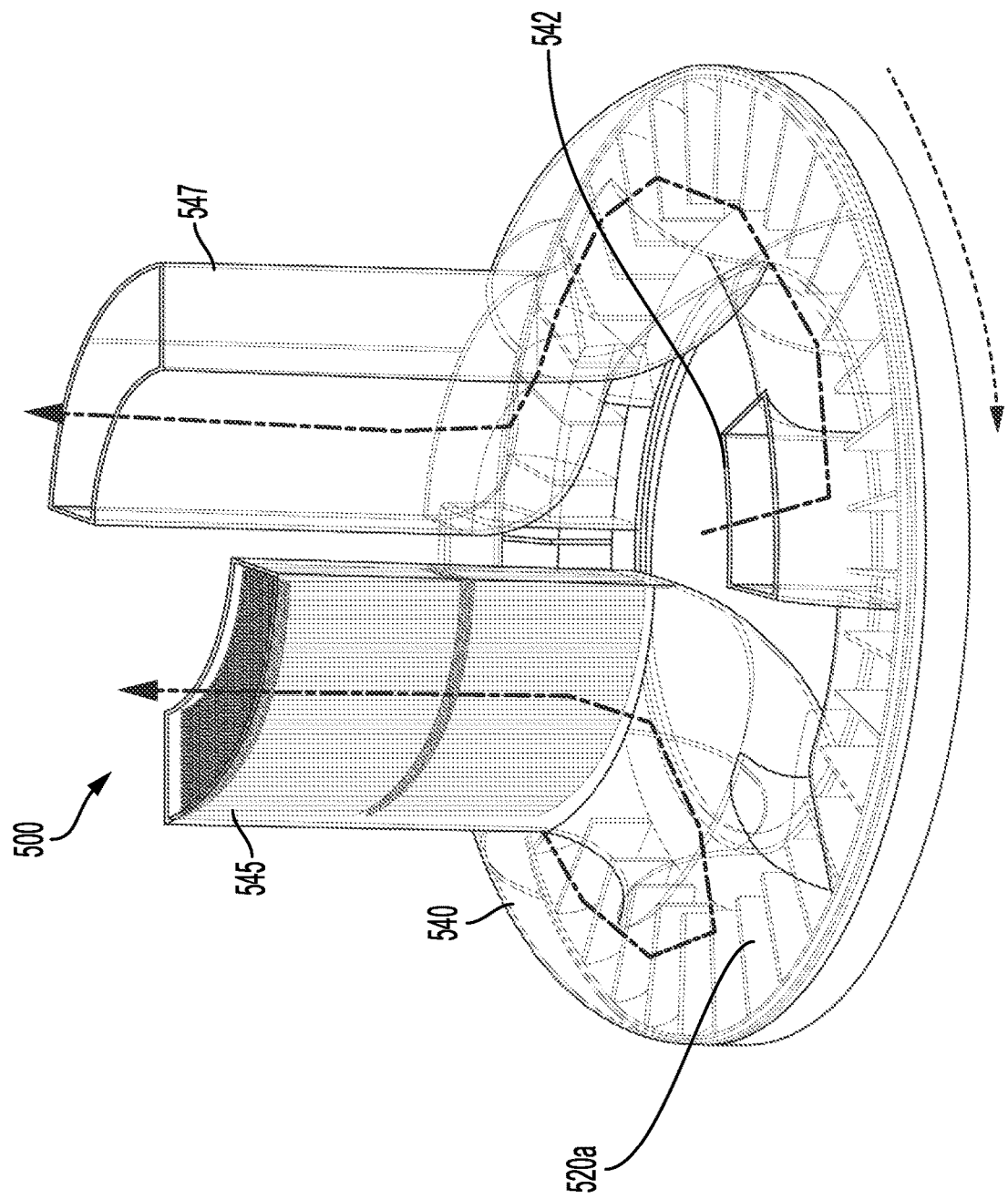
FIG. 5B is an illustration of an electronic spinning assembly and cooling device, according to example embodiments.

FIG. 5B is another embodiment of the device 500, which illustrates how air flows through the device 500. Particularly, the vane cover 540 rotates clockwise. As the vane cover 540 rotates, air suction is created. Air enters the vane cover 540 through the at least one air inlet 542, interacts with the plurality of vanes 520a, and moves counter-clockwise through the vanes 520a. When the air reaches the air duct 545 and the air duct 547, it is drawn up through the air ducts. The air duct 545 and the air duct 547 can direct the airflow to cool specific components in the electronic spinning assembly. In an alternative embodiment, the vane cover can rotate in a counterclockwise direction. In this embodiment, the air would move clockwise through the vanes.

Figure 5C:
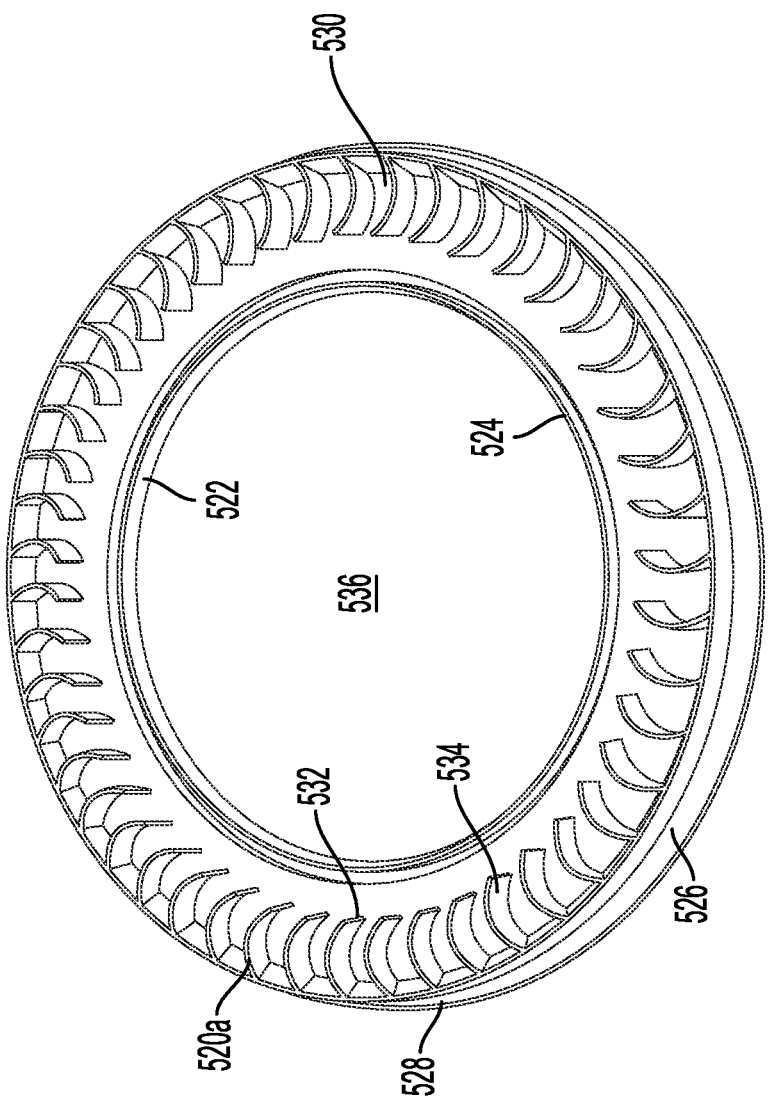
FIG. 5C is an illustration of static vanes in a cooling device, according to an example embodiment.

FIG. 5C illustrates an example embodiment of the plurality of vanes 520a coupled to the static base 522. The plurality of vanes 520a may be arranged in a ring shape around the static base 522. Each vane in the plurality of vanes 520a may include at least a first side 528 and a base 530 that is secured to the static base 522. For example, the first side 528 can be secured to an outer wall 526 of the static base 522 and the base 530 can be secured directly to the static base 522. The plurality of vanes 520a can further include a second side 532. The second side 532 can be positioned adjacent to an inner wall 524 of the static base 522. However, in an example embodiment the second side 532 may not touch the inner wall 524 of the static base 522 in order to optimize airflow. In an alternative embodiment, the second side can be coupled to the inner wall.

The plurality of vanes 520a are shaped or positioned to promote the airflow through the electronic spinning assembly 502. For example, the plurality of vanes 520a can be shaped or positioned based on a direction of rotation of the electronic spinning assembly 502. If the electronic spinning assembly 502 is spinning in a clockwise direction, the vanes 520a may be in a curved shape such that the arc of the curve is pointing in the clockwise direction. Each vane in the plurality of vanes 520a can further include a face 534. The face 534 may be the surface that comes into contact with the airflow. In an example embodiment the face 534 is a smooth surface to minimize resistance.

Figure 5D:
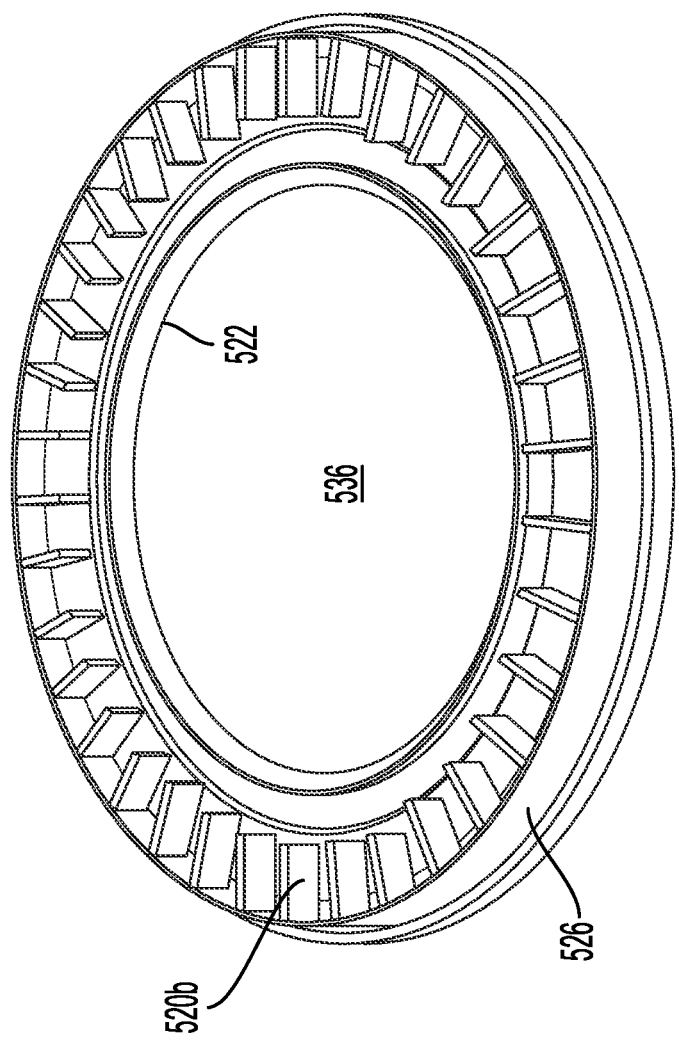
FIG. 5D is an illustration of static vanes in a cooling device, according to an example embodiment.
Figure 5E:
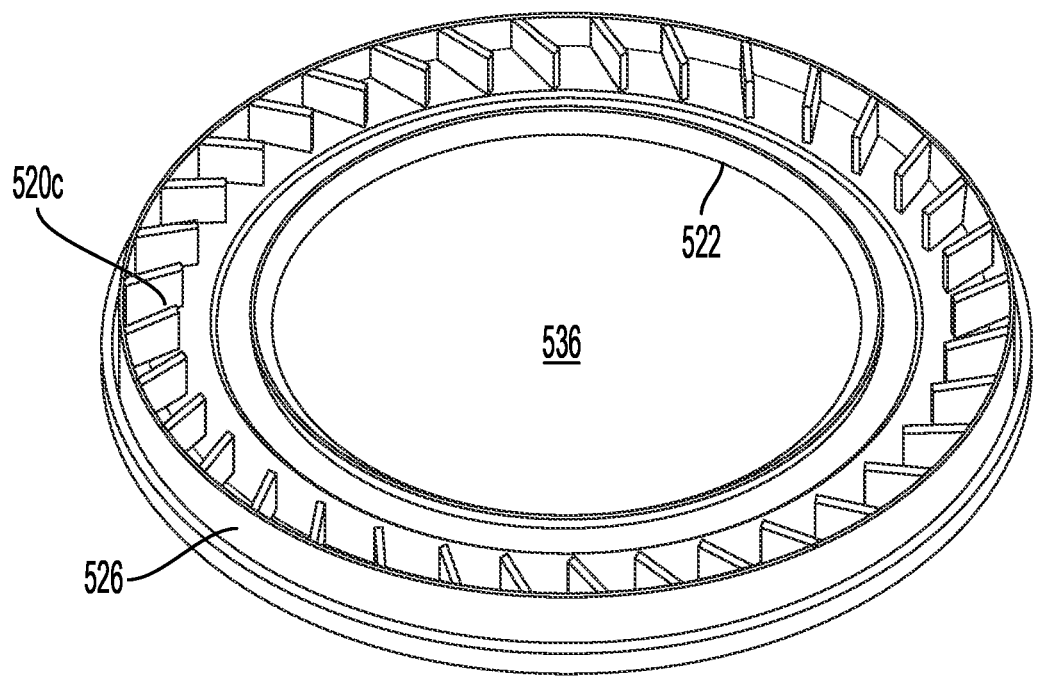
FIG. 5E is an illustration of static vanes in a cooling device, according to an example embodiment.

The shape of the vanes 520a may be varied to optimize performance. For example, FIG. 5D illustrates an example embodiment of a plurality of straight vanes 520b coupled to the static base 522. The straight vanes 520b may meet the outer wall 526 of the static base 522 at 90 degrees. While FIG. 5E illustrates an example embodiment of a plurality of angled vanes 520c coupled to the static base 522. The angled vanes 520c may meet the outer wall 526 at either an acute or obtuse angle. Other vane shapes are also possible. For example, the vane shapes previously described could be combined.

The number of vanes in the plurality of vanes 520a may also be optimized for performance. In an example embodiment, the plurality of vanes 520a includes 36 vanes. The vanes may be arranged around the static base 522 one right after the other. Any number of vanes is possible. For example, the plurality of vanes can include 48 vanes or 60 vanes arranged around the static base 522.

As illustrated in FIGS. 5C through 5E, the plurality of vanes are coupled to the static base 522 The static base 522 can be in the shape of a ring, with an opening 536 at the center. The ring shape may allow air to enter the device by coming up from the bottom of the device. However, it is also possible for the static base to be solid with no opening. Alternatively, the base could be mostly solid, but could include vents that could allow air to enter. The static base 522 also includes the inner wall 524 and the outer wall 526. The inner wall 524 and outer wall 526 may rise to meet the vane cover in order to enclose the plurality of vanes. In an example embodiment, there may be a small gap between the inner wall 524 and the outer wall 526 and the vane cover in order to take into account for vibrations while also balancing and minimizing airflow leakage.

Figure 5F:
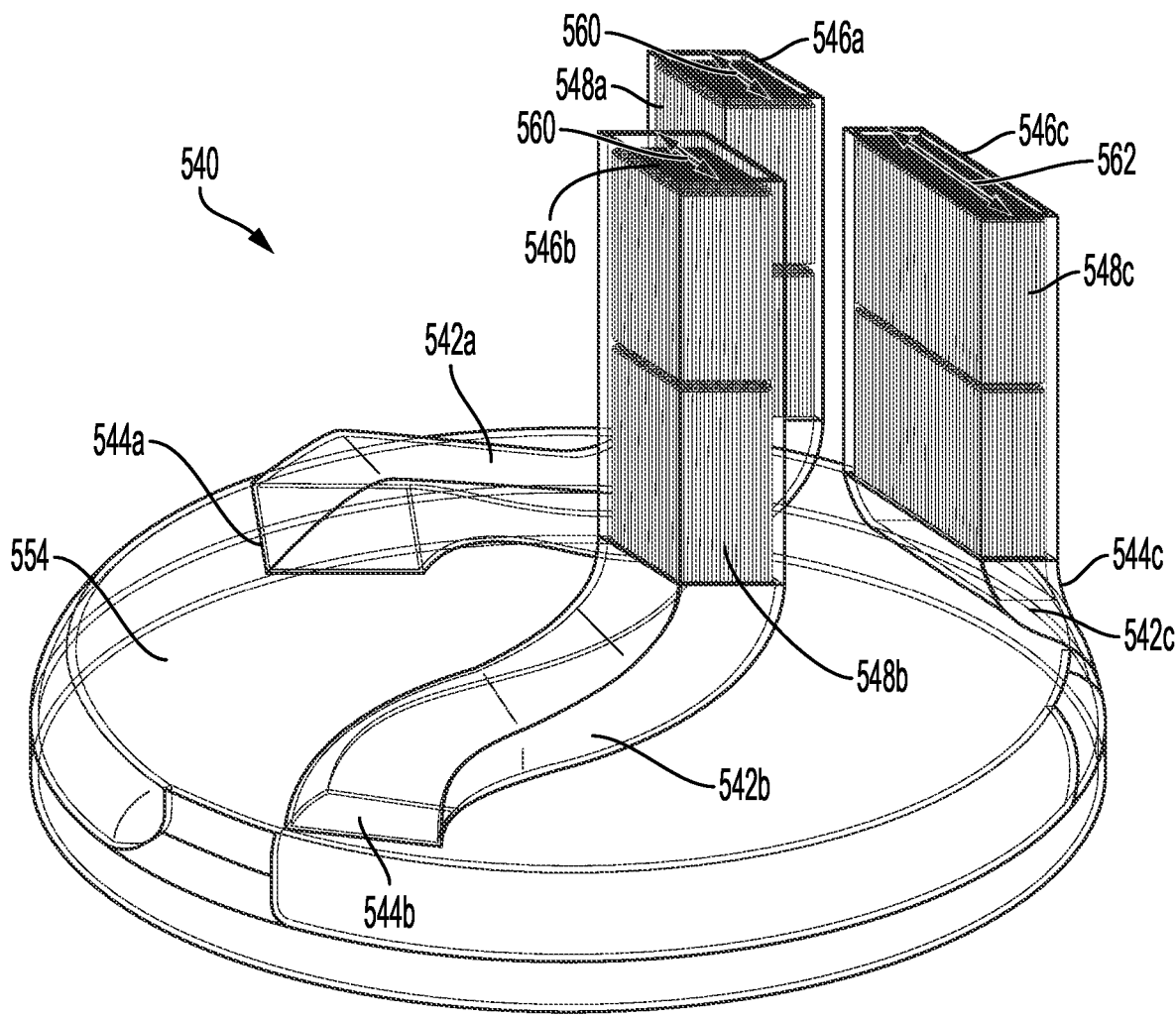
FIG. 5F is an illustration of a vane cover in a cooling device, according to example embodiments.

FIG. 5F illustrates the outside of the vane cover 540. The vane cover could be made from a plurality of materials including plastic, metal, ceramic, etc. As illustrated, the vane cover 540 could be a torus shape, with a flat lid 554. The smooth torus shape may assist in preventing the loss of air pressure that results from sharp turns. However, in an example embodiment the vane cover could also include flat sides leading to the lid. The vane cover 540 may be rotatably coupled to the static base, and may be circular in order to match the shape of the static base. Additionally, the vane cover 540 may be circular so that it can rotate with the electronic spinning assembly.

The vane cover 540 may at least partially enclose the plurality of vanes between the vane over 540 and the static base. As previously mentioned, a small gap may be present between the static base and the vane cover 540 to account for vibrations. Other gaps may also be present in the vane cover 540. For example, air inlets may be molded into the vane cover 540. The air inlets may be positioned in the center of the ring that is formed by the static base and the vane cover 540.

In an example embodiment, at least one air duct can extend from the vane cover to direct airflow. The at least one air duct may be optimized to minimize flow restriction. As illustrated in FIG. 5F, the vane cover 540 can include a plurality of air ducts, including a first air duct 542a, a second air duct 542b, and a third air duct 542c which extend from the lid 554 of the vane cover 540. The first air duct 542a, the second air duct 542b, and the third air duct 542c may each include an inlet 544a, 544b, 544c and an outlet 546a, 546b, 546c. In an example embodiment, the air duct inlets 544a, 544b, 544c are positioned in the lid 554 of the vane cover 540. The air ducts 542a, 542b, 542c need not be evenly spaced along the vane cover 540. In fact, the placement of the air ducts can contribute to the amount of air flow through the air ducts. However, in an alternative embodiment the air ducts could be evenly spaced. Additionally, although FIG. 5F illustrates three air ducts, any number of air ducts are possible, depending on the size of the vane cover 540.

The air ducts 542a, 542b, 542c can be shaped such that the outlet 546a, 546b, 546c is positioned near the electronic spinning assembly and configured to direct the airflow toward the electronic assembly. In an example embodiment the air ducts 542a, 542b, 542c can be shaped to optimize the airflow toward the electronic assembly. For example, the air ducts 542a, 542b, 542c can be optimized for homogeneous flow across the components of the electronic spinning assembly, to achieve ideal cooling performance. To achieve homogenous flow, the 542a, 542b, 542c may each include a fin stack 548a, 548b, 548c to equalize airflow through the air duct.

In an example embodiment, the first air duct 542a and the second air duct 542b have a first cross-sectional area 560, and the third air duct 542c has a second cross-sectional area 562. This is to deliver different airflows to different components in the electronic spinning assembly. For example, the first air duct 542a and the second air duct 542b may be the same size and shape because they are cooling similar components. The first air duct 542a and the second air duct 542b may be square, while the third air duct 542 is rectangular. Additionally, the length of the first air duct 542a and the second air duct 542b may be different than the length of the third air duct 542c to account for different airflow requirements.

Further, the first air duct 542a, the second air duct 542b, and the third air duct 542c are shaped without any sharp turns to avoid losing air pressure. Sharp turns can decrease the air pressure within the device; therefore it may be beneficial to avoid them. Instead, the air ducts 542a, 542b, 542c can be shaped with soft turns, or no turns at all. For example, the third air duct 542c extends straight up from the vane cover 540, while the first air duct 542a and the second air duct 542b extend from the lid 554 of the vane cover 540 and gently curve to reach the desired position of their respective outlets 546a, 546b.

Figure 5G:
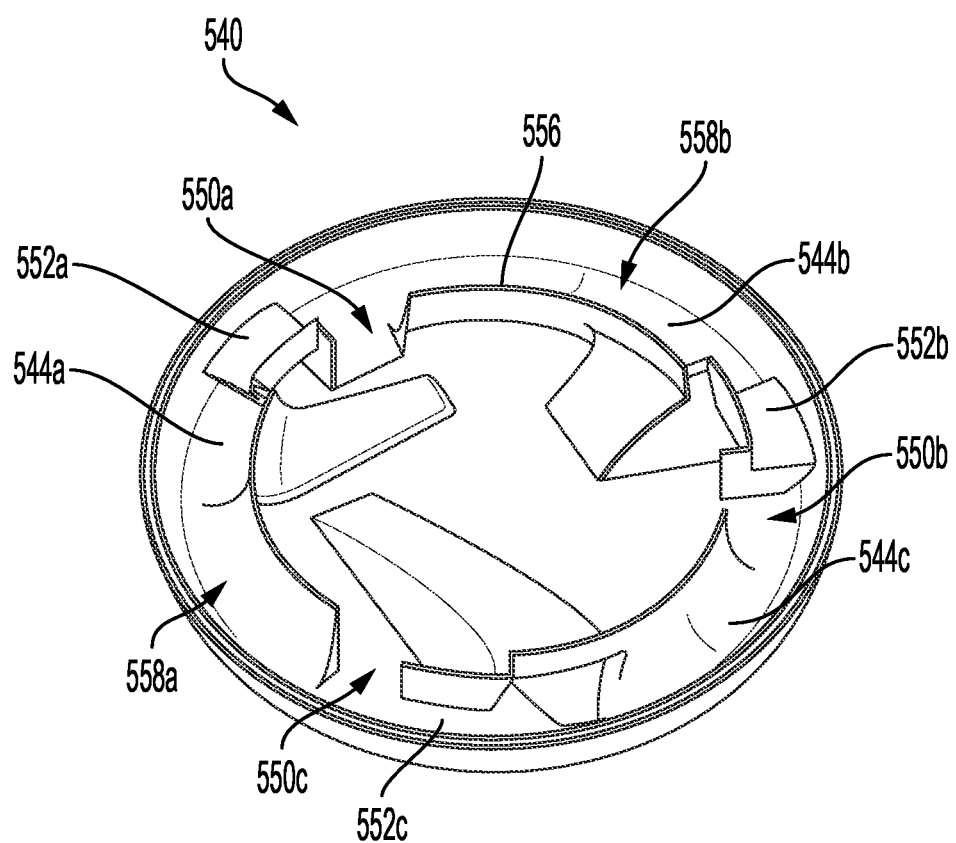
FIG. 5G is an illustration of an inside of the vane cover, according to example embodiments.

FIG. 5G illustrates the inside of the vane cover 540. In an example embodiment, the vane cover 540 can include at least one air inlet configured to act as an air intake for an airflow. For example, FIG. 5G illustrates three air inlets 550a, 550b, 550c which are molded into an interior wall 556 of the vane cover 540. In an example embodiment, the interior wall 556 of the vane cover 540 may meet the inner wall of the static base. The air inlets may be positioned on the interior wall 556 in the center of the ring that is formed by the static base and the vane cover 540. The air inlets 550a, 550b, 550c may be optimized to minimize flow restriction. The air inlets 550a, 550b, 550c may draw in air which then passes to the air duct inlets 544a, 544b, 544c. The three air inlets 550a, 550b, 550c are not evenly spaced from each other. However, in an alternative embodiment they could be evenly spaced.

In an example embodiment, the interior wall 556 can create a plurality of torus channels 558a, 558b. The plurality of channels 558a, 558b feed the air inlets 550a, 550b, 550c air flow. In an example embodiment, the lengths of the plurality of channels 558a, 558b is varied to match the specific airflow requirement of each air duct.

The vane cover 540 can further include at least one choke point disposed in the vane cover 540. The choke point can be a flat surface molded into the vane cover 540. FIG. 5G illustrates three choke points 552a, 552b, 552c disposed into the vane cover 540. The choke points 552a, 552b, 552c are configured to increase a pressure of the airflow through the device 500. The flat surfaces of the choke points 552a, 552b, 552c pass very close to the stationary vanes. As the vane cover 540 rotates, the choke points 552a, 552b, 552c move across the vanes and draw in air through the air inlets 550a, 550b, 550c. The choke points 552a, 552b, 552c may include a smooth surface in order to minimize airflow loss.

Figure 6:
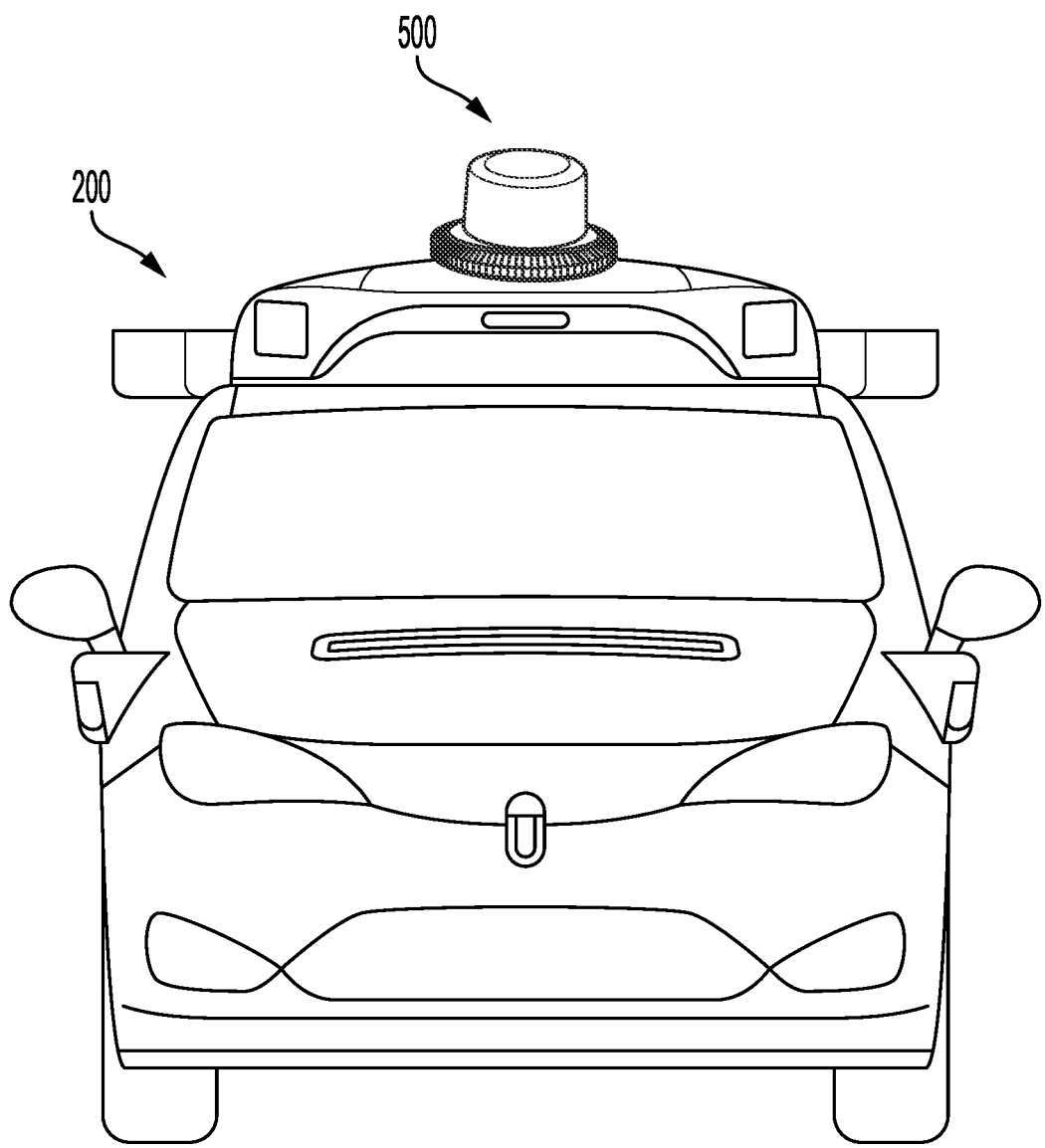
FIG. 6 is an illustration of an electronic spinning assembly and air cooling device mounted to a vehicle, according to an example embodiment.

In an example embodiment, the device 500 for air-cooling a spinning electronic assembly can be mounted on a vehicle. FIG. 6 illustrates said device mounted on a vehicle. The device can be any of the embodiments which were previously described herein, such as device 500. The vehicle can be the vehicle previously described, such as vehicle 200. For example, the vehicle can be an autonomous vehicle. The device can assist in cooling electronic spinning assemblies on the vehicle 200.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flow charts in the figures and as discussed herein, each step, block, operation, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step, block, or operation that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer-readable medium such as a storage device including RAM, a disk drive, a solid state drive, or another storage medium.

Moreover, a step, block, or operation that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A device comprising:
   a plurality of vanes coupled to a static base;
   a vane cover rotatably coupled to the static base, wherein the vane cover comprises:
      at least one air inlet;
      at least one air duct extending from the vane cover, wherein the at least one air duct comprises an inlet and an outlet, wherein the outlet is configured to direct an airflow toward an electronic spinning assembly; and
      at least one choke point disposed in the vane cover, wherein the at least one choke point is configured to increase a pressure of the airflow.

2. The device of claim 1, wherein the at least one air duct is shaped to optimize the airflow toward the electronic spinning assembly.

3. The device of claim 1, wherein the at least one air duct comprises a fin stack, wherein the fin stack is configured to equalize the airflow through the at least one air duct.

4. The device of claim 1, wherein:
   the at least one air inlet comprises three air inlets configured to act as air intakes for the airflow;
   the at least one air duct comprises three air ducts extending from the vane cover and configured to direct the airflow; and
   the at least one choke point comprises three choke points disposed in the vane cover adjacent to the vanes and configured to increase the pressure of the airflow.

5. The device of claim 4, wherein the three air ducts comprise a first air duct and a second air duct, each having a first cross-sectional area, and a third air duct having a second cross-sectional area.

6. The device of claim 1, wherein the vane cover at least partially encloses the plurality of vanes.

7. The device of claim 1, wherein the vane cover is coupled to the electronic spinning assembly and configured to rotate with the electronic spinning assembly.

8. The device of claim 7, wherein the plurality of vanes are shaped or positioned to promote the airflow through the electronic spinning assembly.

9. The device of claim 8, wherein the plurality of vanes are shaped or positioned based on a direction of rotation of the electronic spinning assembly.

10. The device of claim 9, wherein the plurality of vanes comprise a curved shape.

11. The device of claim 7, wherein the electronic spinning assembly comprises at least one sensor.

12. The device of claim 11, wherein the at least one sensor comprises at least one light detection and ranging (lidar) device.

13. A system comprising:
a vehicle;
a plurality of vanes coupled to a static base, wherein the static base is mounted to the vehicle;
a vane cover rotatably coupled to the static base, wherein the vane cover comprises:
at least one air inlet;
at least one air duct extending from the vane cover, wherein the at least one air duct comprises an inlet and an outlet, wherein the outlet is configured to direct an airflow toward an electronic spinning assembly; and
at least one choke point disposed in the vane cover, wherein the at least one choke point is configured to increase a pressure of the airflow.

14. The system of claim 13, wherein the at least one air duct is shaped to optimize the airflow toward the electronic spinning assembly.

15. The system of claim 13 wherein the at least one air duct comprises a fin stack, wherein the fin stack is configured to equalize the airflow through the at least one air duct.

16. The system of claim 13, wherein:
the at least one air inlet comprises three air inlets configured to act as air intakes for the airflow;
the at least one air duct comprises three air ducts extending from the vane cover and configured to direct the airflow; and
the at least one choke point comprises three choke points disposed in the vane cover adjacent to the vanes and configured to increase the pressure of the airflow.

17. The system of claim 16, wherein the three air ducts comprise a first air duct and a second air duct, each having a first cross-sectional area, and a third air duct having a second cross-sectional area.

18. The system of claim 13, wherein the plurality of vanes comprise a curved shape.

19. The system of claim 13, wherein the electronic spinning assembly comprises at least one sensor.

20. The system of claim 19, wherein the at least one sensor comprises at least one light detection and ranging (lidar) device.

* * * * *